US012431419B2

(12) United States Patent
Jeong et al.

(10) Patent No.: US 12,431,419 B2
(45) Date of Patent: Sep. 30, 2025

(54) CIRCUIT BOARD

(71) Applicant: LG INNOTEK CO., LTD., Seoul (KR)

(72) Inventors: Jae Hun Jeong, Seoul (KR); Jong Bae Shin, Seoul (KR); Soo Min Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 156 days.

(21) Appl. No.: 18/013,624

(22) PCT Filed: Jun. 29, 2021

(86) PCT No.: PCT/KR2021/008143
§ 371 (c)(1),
(2) Date: Dec. 29, 2022

(87) PCT Pub. No.: WO2022/005152
PCT Pub. Date: Jan. 6, 2022

(65) Prior Publication Data
US 2023/0290716 A1    Sep. 14, 2023

(30) Foreign Application Priority Data

Jun. 29, 2020  (KR) .................. 10-2020-0079192
Jun. 29, 2020  (KR) .................. 10-2020-0079232
Jun. 29, 2020  (KR) .................. 10-2020-0079248

(51) Int. Cl.
*H05K 1/02*     (2006.01)
*H01L 21/48*    (2006.01)
(Continued)

(52) U.S. Cl.
CPC .... *H01L 23/49838* (2013.01); *H01L 21/4857* (2013.01); *H01L 23/13* (2013.01);
(Continued)

(58) Field of Classification Search
CPC .............................. H05K 1/0281; H05K 1/183
See application file for complete search history.

(56) References Cited

U.S. PATENT DOCUMENTS 7,656,023 B2    2/2010  Sunohara et al.
8,115,307 B2    2/2012  Toyama et al.
(Continued)

FOREIGN PATENT DOCUMENTS

JP    2005-183680    7/2005
JP    2012-164952    8/2012
(Continued)

OTHER PUBLICATIONS

International Search Report dated Oct. 26, 2021 issued in Application No. PCT/KR2021/008143.
(Continued)

*Primary Examiner* — Jeremy C Norris
(74) *Attorney, Agent, or Firm* — KED & ASSOCIATES, LLP

(57) ABSTRACT

A printed circuit board according to an embodiment comprises: a first insulation layer; a first circuit pattern disposed on one surface of the first insulation layer and including a pad; and a second insulation layer disposed on one surface of the first insulation layer and including a cavity exposing the pad, wherein the first circuit pattern includes a 1-1 metal layer disposed on one surface of the first insulation layer, and a 1-2 metal layer disposed on one surface of the 1-1 metal layer, wherein the area of the 1-1 metal layer is greater than the area of the 1-2 metal layer, and at least a portion of a side surface of the 1-1 metal layer is exposed through the cavity.

13 Claims, 18 Drawing Sheets

(51) Int. Cl.
    *H01L 23/13*     (2006.01)
    *H01L 23/498*     (2006.01)
    *H05K 1/03*     (2006.01)
    *H05K 3/00*     (2006.01)
    *H05K 3/46*     (2006.01)
    *H05K 1/18*     (2006.01)

(52) U.S. Cl.
    CPC .. *H01L 23/49822* (2013.01); *H01L 23/49894* (2013.01); *H05K 1/0281* (2013.01); *H05K 1/0298* (2013.01); *H05K 1/036* (2013.01); *H05K 3/0032* (2013.01); *H05K 3/4688* (2013.01); *H05K 3/4697* (2013.01); *H05K 1/186* (2013.01); *H05K 2201/10015* (2013.01); *H05K 2201/10022* (2013.01); *H05K 2201/1003* (2013.01); *H05K 2201/10166* (2013.01)

(56) References Cited

U.S. PATENT DOCUMENTS

| | | | |
|---|---|---|---|
| 8,785,788 | B2 | 7/2014 | Shimizu et al. |
| 11,470,721 | B2 | 10/2022 | Jung |
| 11,979,985 | B2 | 5/2024 | Jung |
| 2007/0207607 | A1* | 9/2007 | Lee ............... H01L 21/4857 257/E23.101 |
| 2010/0206619 | A1* | 8/2010 | Chen ............... H01L 23/13 174/262 |
| 2012/0186861 | A1 | 7/2012 | Shimizu et al. |
| 2015/0022982 | A1* | 1/2015 | Mikado ............... H01G 2/06 29/841 |
| 2017/0243841 | A1 | 8/2017 | Ko et al. |
| 2020/0152566 | A1 | 5/2020 | Oh et al. |
| 2021/0022250 | A1 | 1/2021 | Jung et al. |
| 2022/0061158 | A1 | 2/2022 | Jung |
| 2023/0016067 | A1 | 1/2023 | Jung |
| 2024/0260189 | A1 | 8/2024 | Jung |

FOREIGN PATENT DOCUMENTS

| | | |
|---|---|---|
| JP | 2015-198128 | 11/2015 |
| JP | 2019-046860 | 3/2019 |
| JP | 2019-121626 | 7/2019 |
| JP | 2019-176068 | 10/2019 |
| KR | 10-2005-0099553 | 10/2005 |
| KR | 10-2007-0015861 | 2/2007 |
| KR | 10-2011-0131049 | 12/2011 |
| KR | 10-1233642 | 2/2013 |
| KR | 10-2016-0007196 | 1/2016 |
| KR | 10-1726568 | 4/2017 |
| KR | 10-2017-0067472 | 6/2017 |
| KR | 10-1766476 | 8/2017 |
| KR | 10-2018-0070276 | 6/2018 |
| KR | 10-2019-0115911 | 10/2019 |
| KR | 10-2020-0055415 | 5/2020 |
| KR | 10-2020-0070773 | 6/2020 |

OTHER PUBLICATIONS

Japanese Office Action dated Mar. 5, 2024 issued in Application No. 2022-581620.
Korean Office Action dated Oct. 2, 2024, issued in Application No. 10-2020-0079192.
Korean Office Action dated Oct. 2, 2024, issued in Application No. 10-2020-0079248.
Korean Office Action dated Dec. 9, 2024, issued in Application No. 10-2020-0079232.
Korean Office Action dated Jun. 16, 2025, issued in Application No. 10-2020-0079248.
Korean Office Action dated Jun. 19, 2025 issued in Application No. 10-2020-0079192.

* cited by examiner

[FIG. 1]
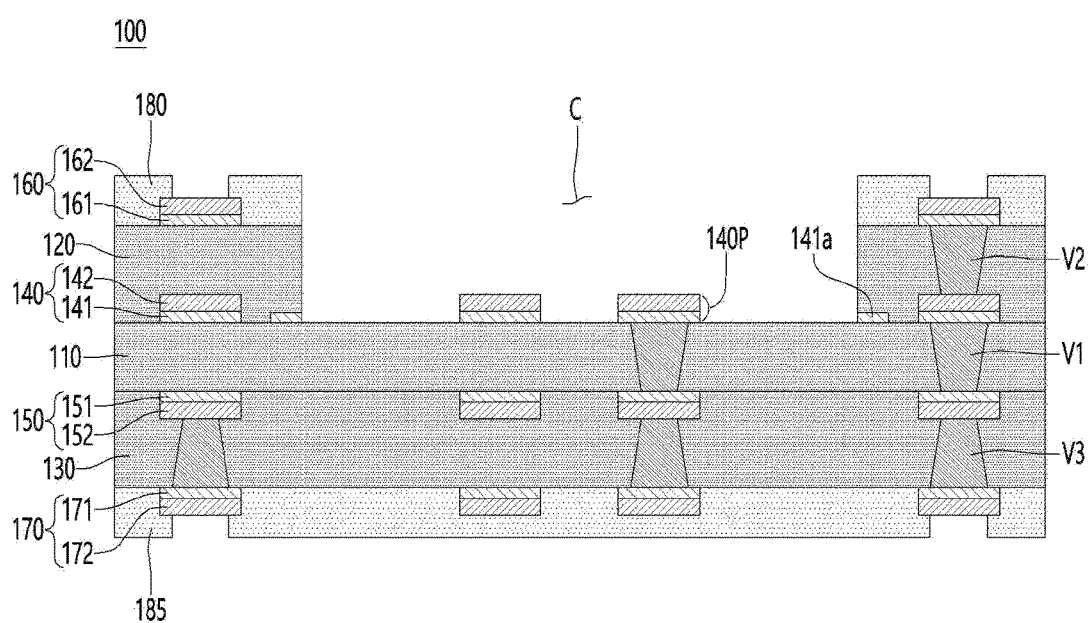

[FIG. 2]
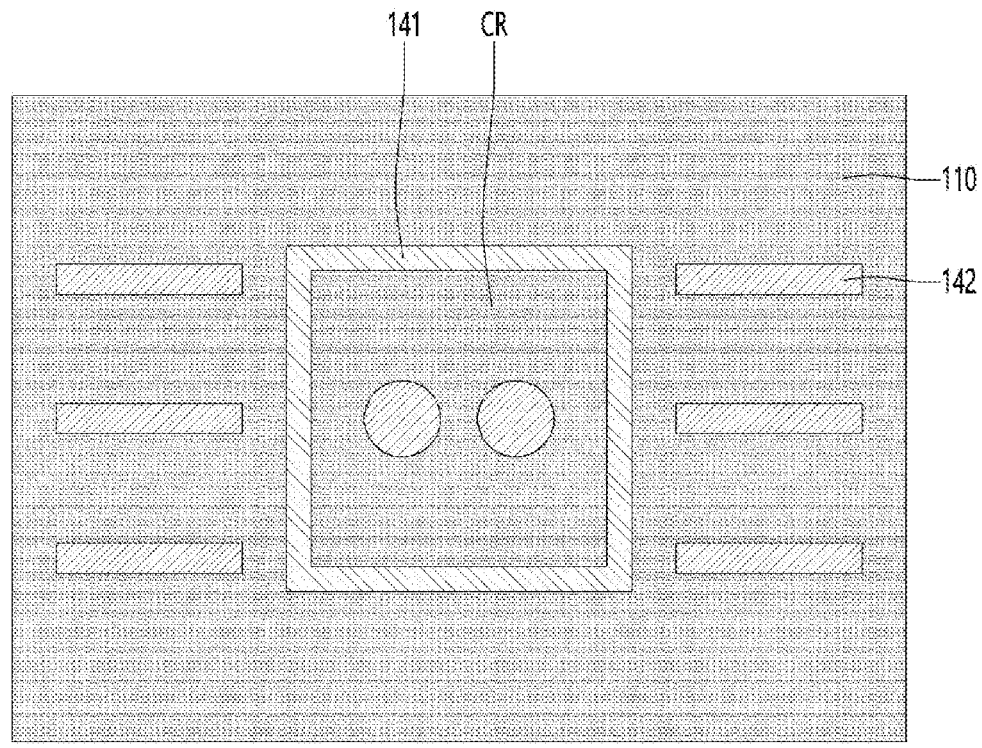

【FIG. 3】
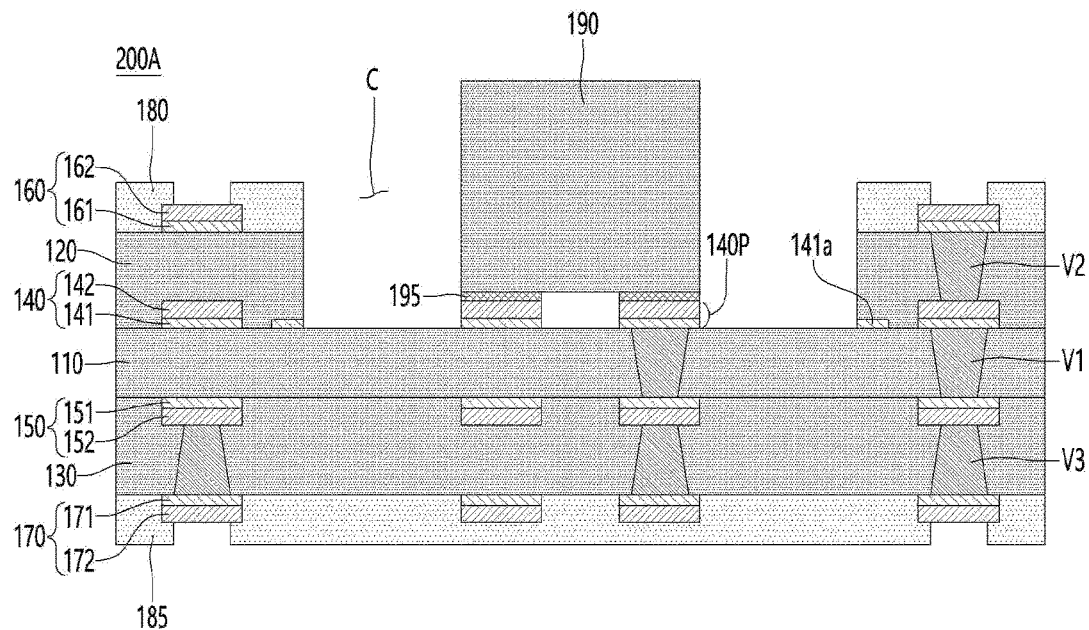
【FIG. 4】
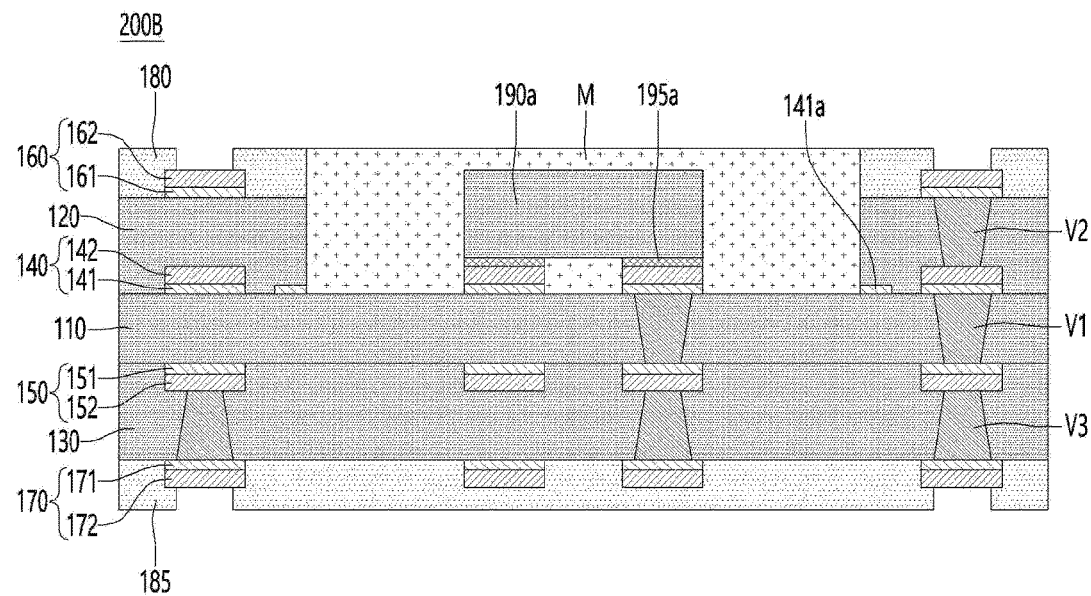

[FIG. 5]
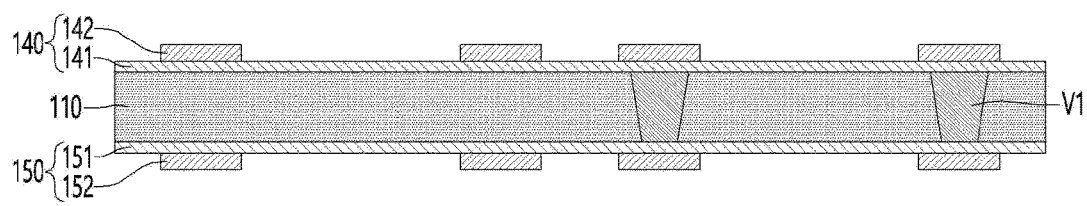
[FIG. 6]
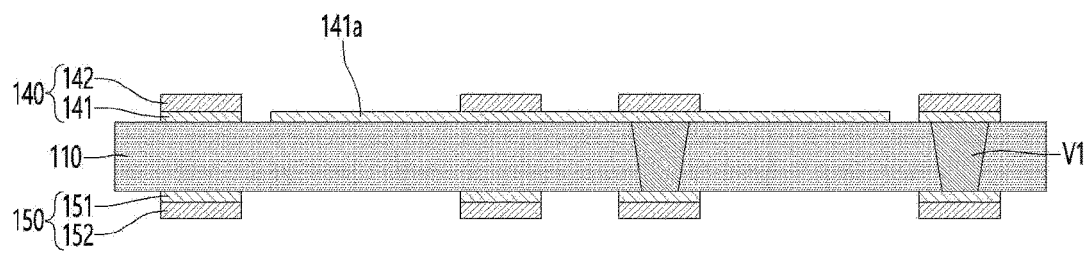
[FIG. 7]
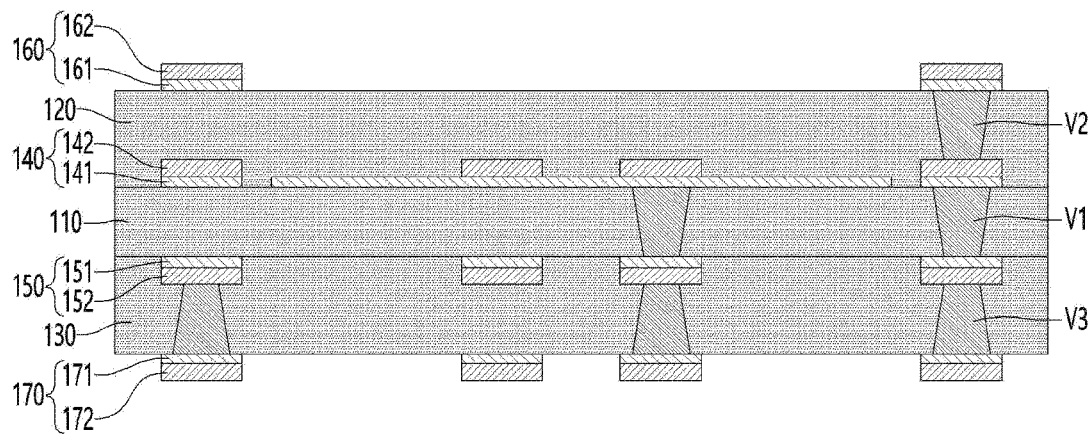

[FIG. 8]
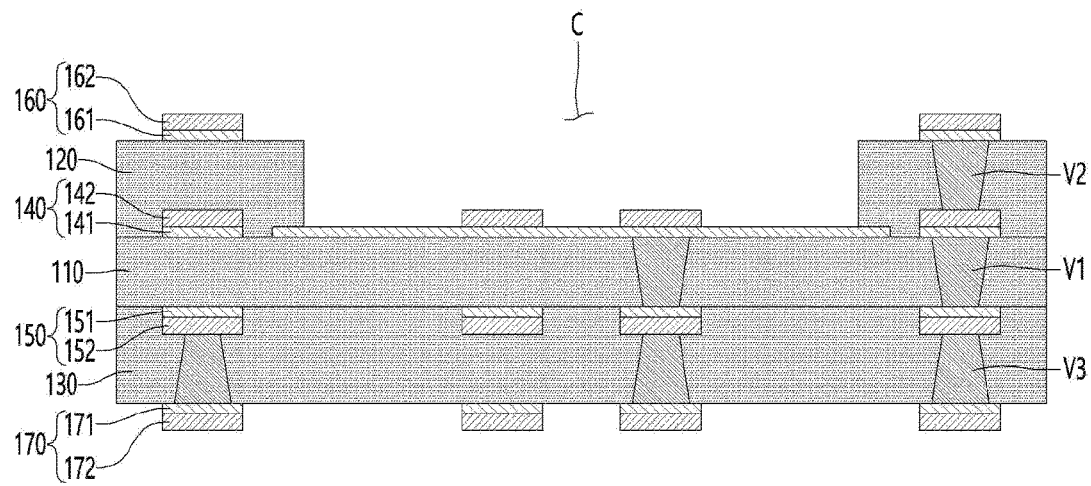
[FIG. 9]
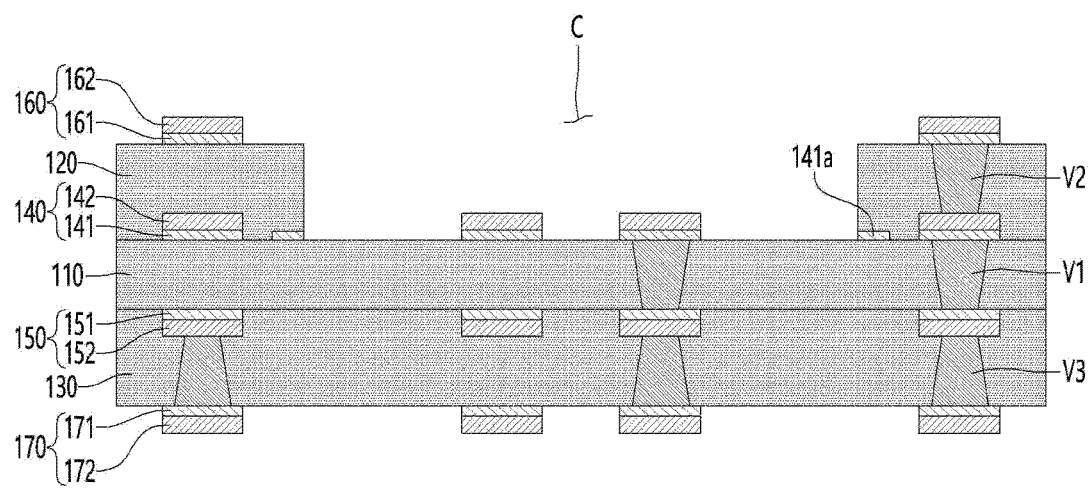

[FIG. 10]
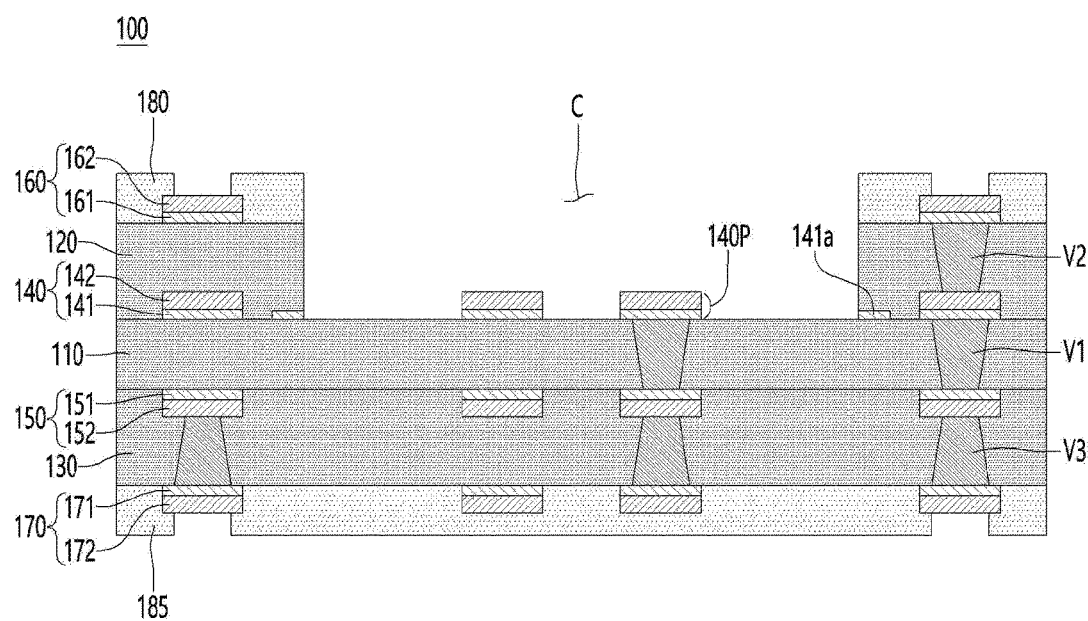

[FIG. 11]
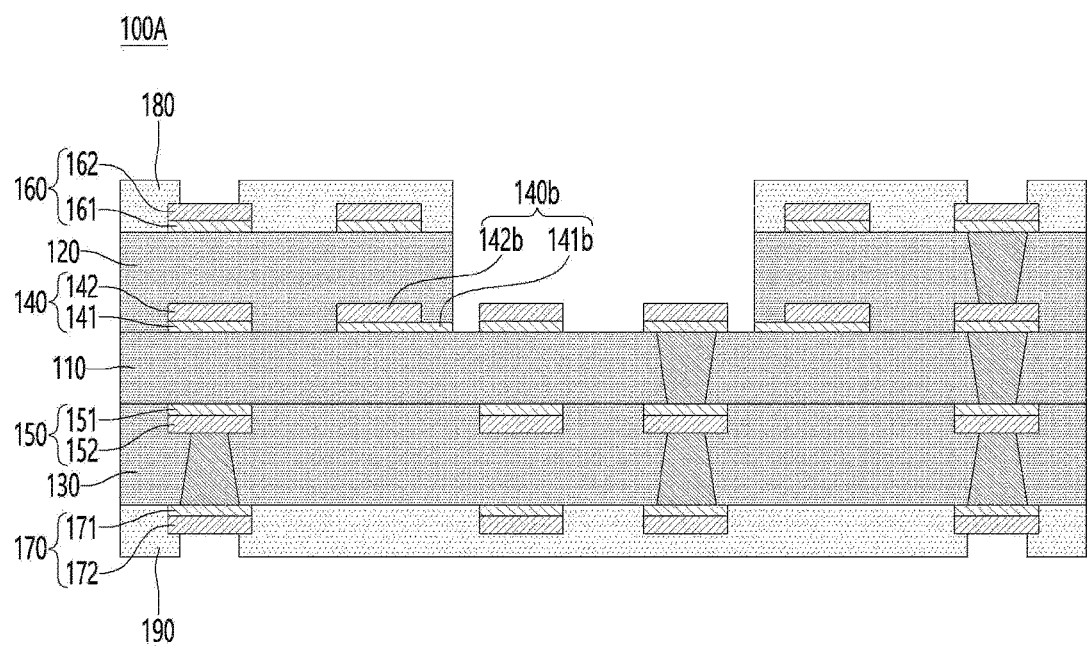

[FIG. 12]
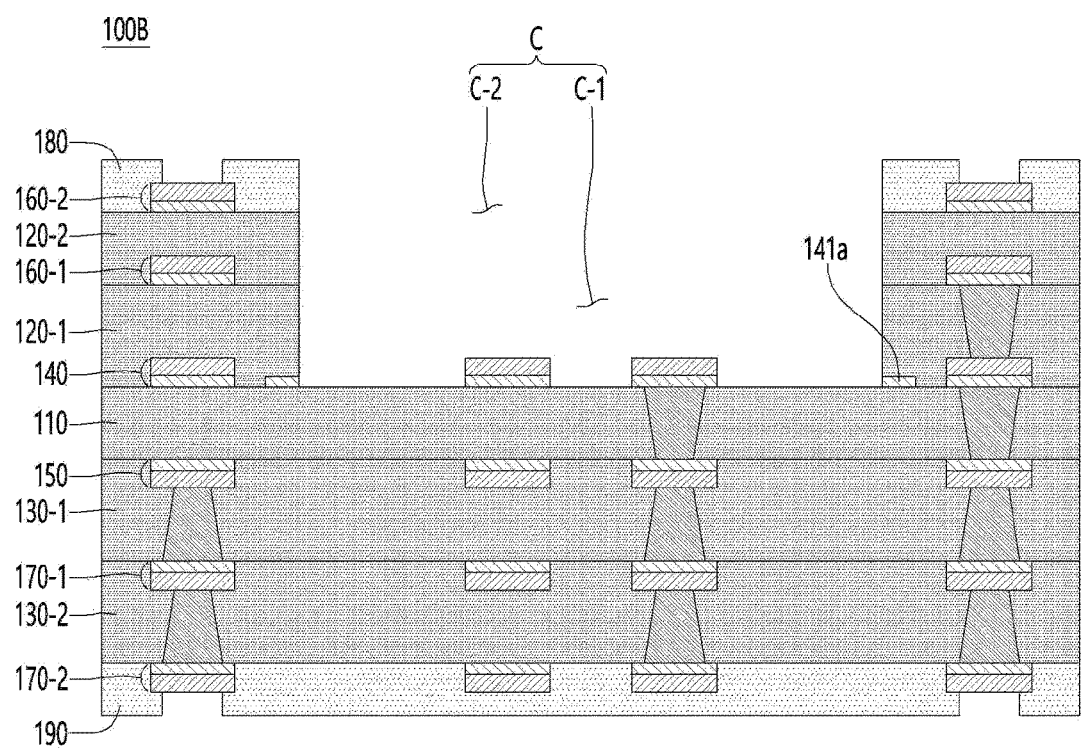

[FIG. 13]
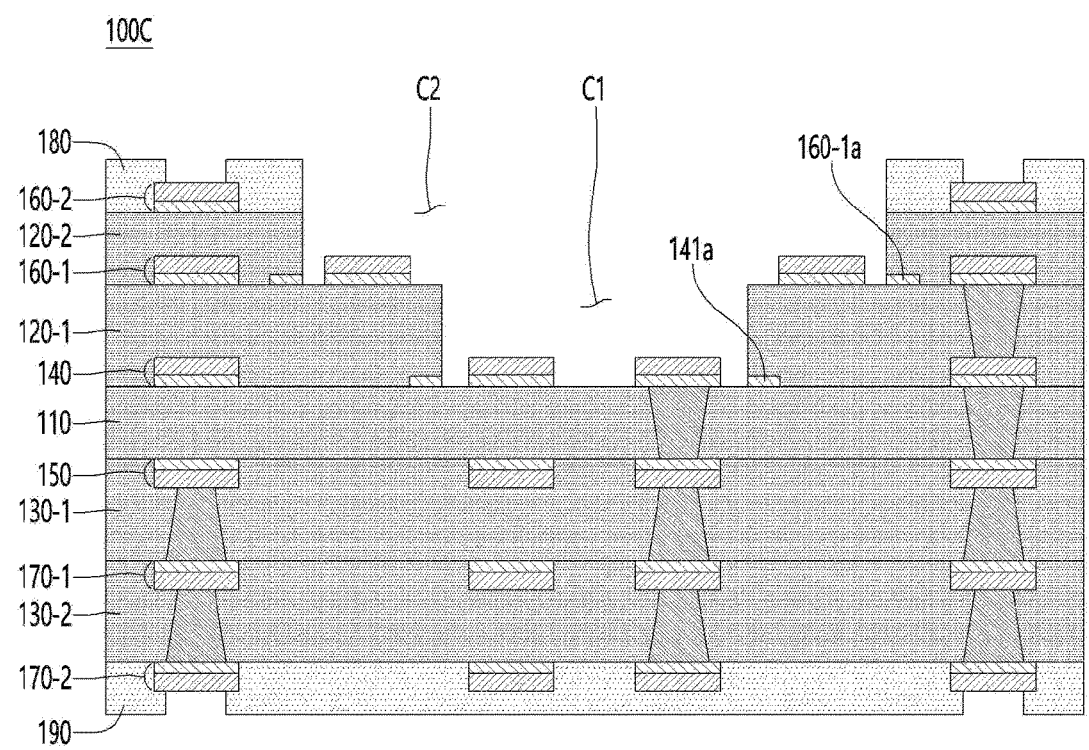

[FIG. 14]
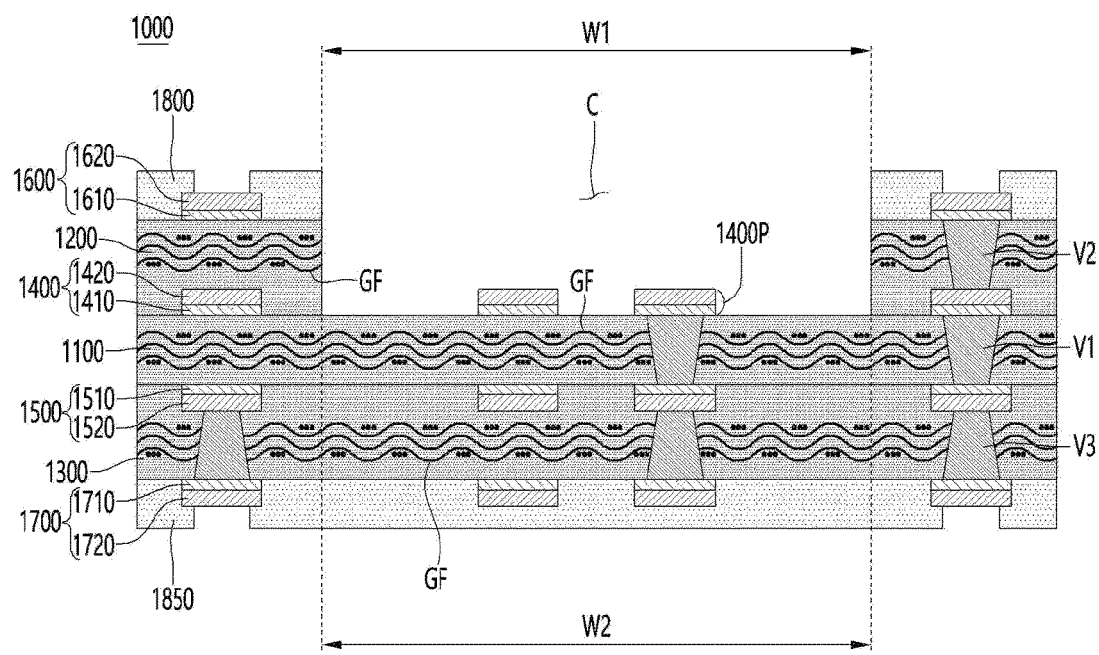

[FIG. 15]
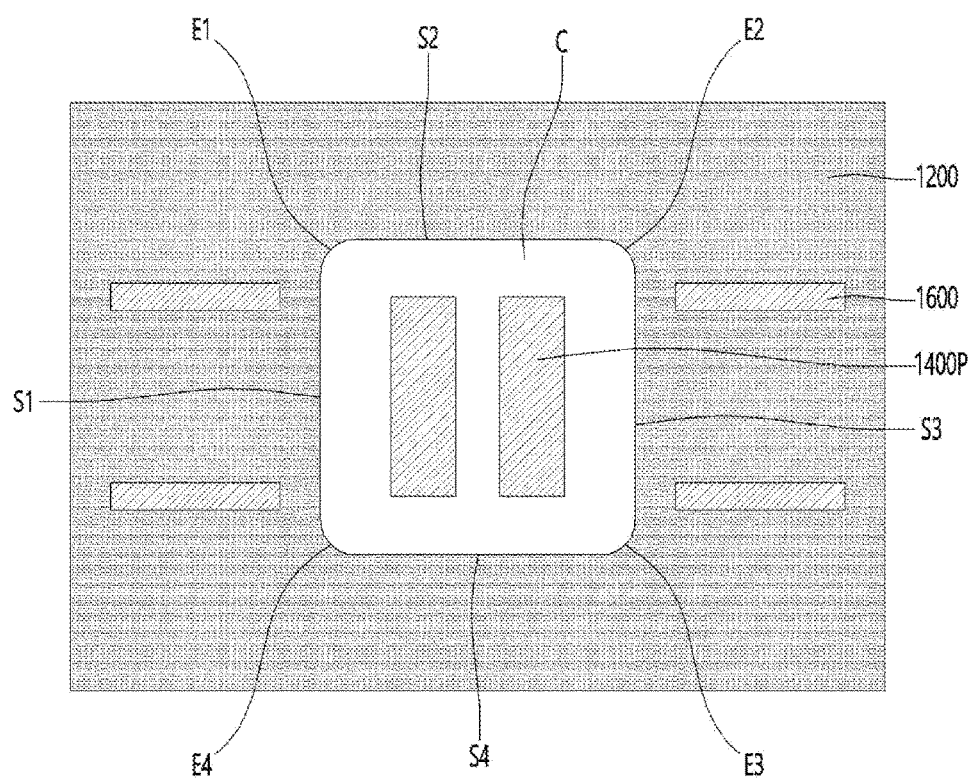
[FIG. 16]
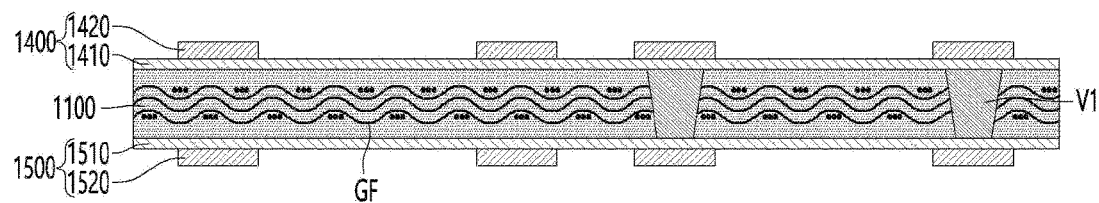

[FIG. 17]
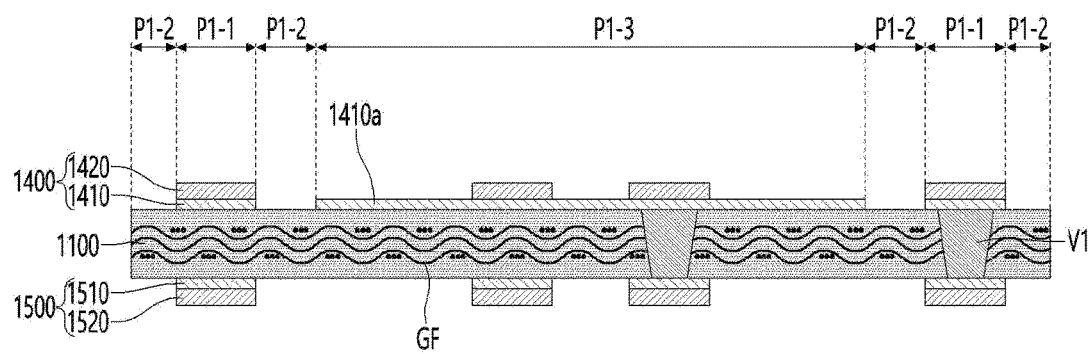
[FIG. 18]
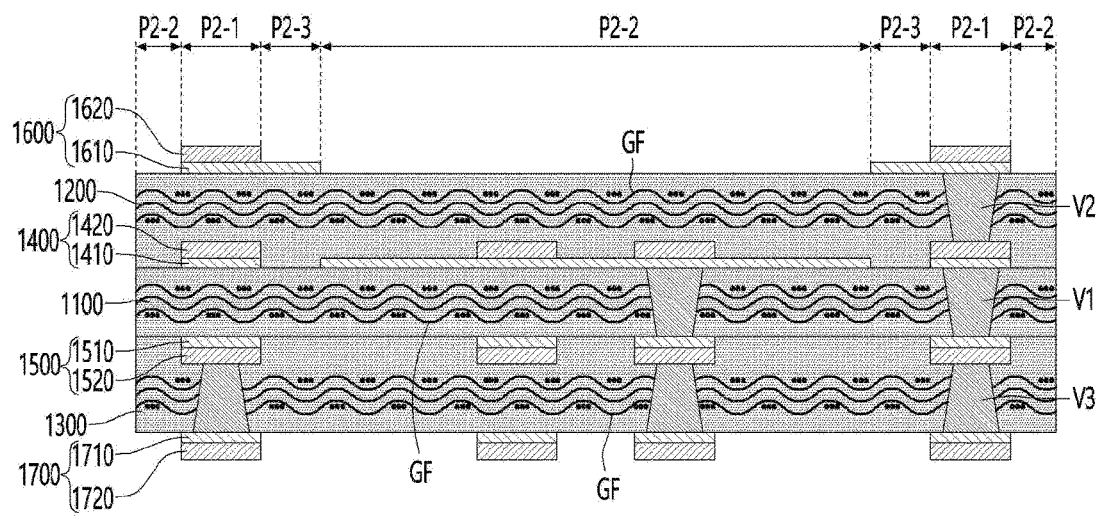

[FIG. 19]
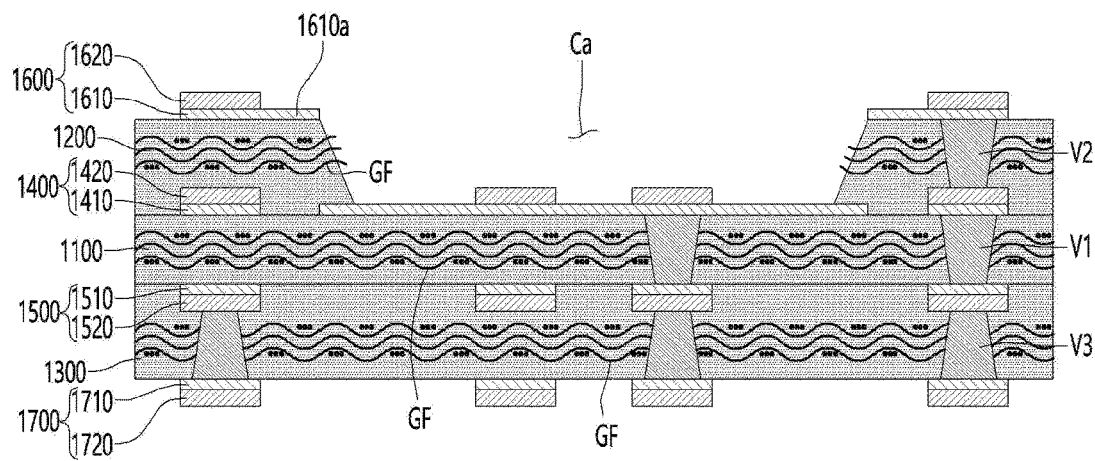
[FIG. 20]
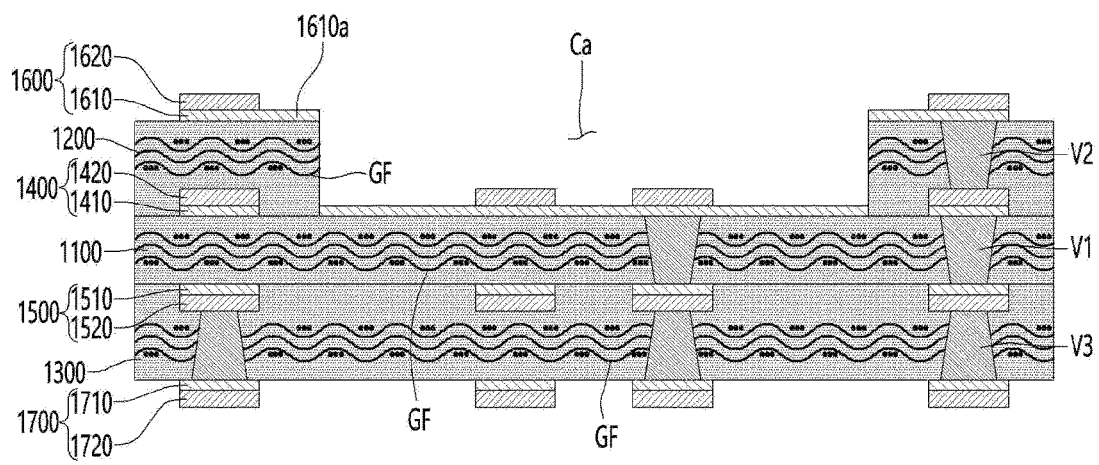

[FIG. 21]
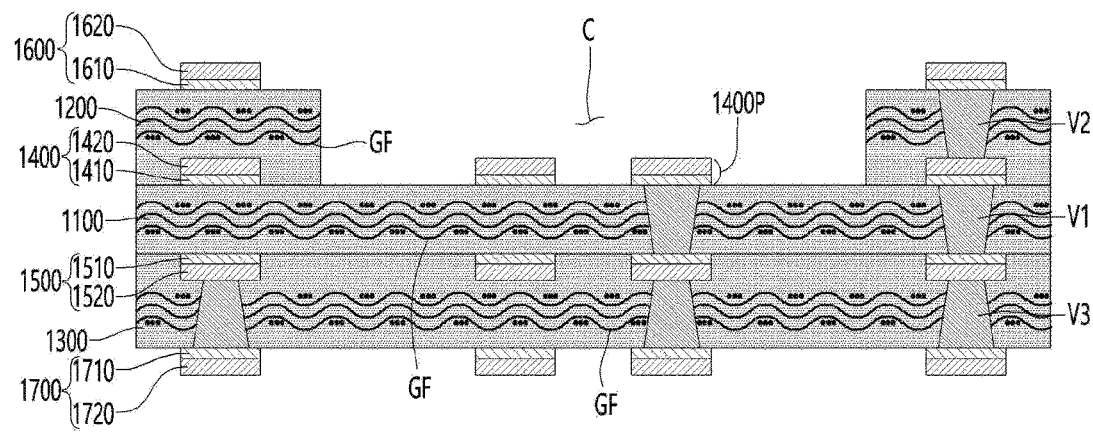
[FIG. 22]
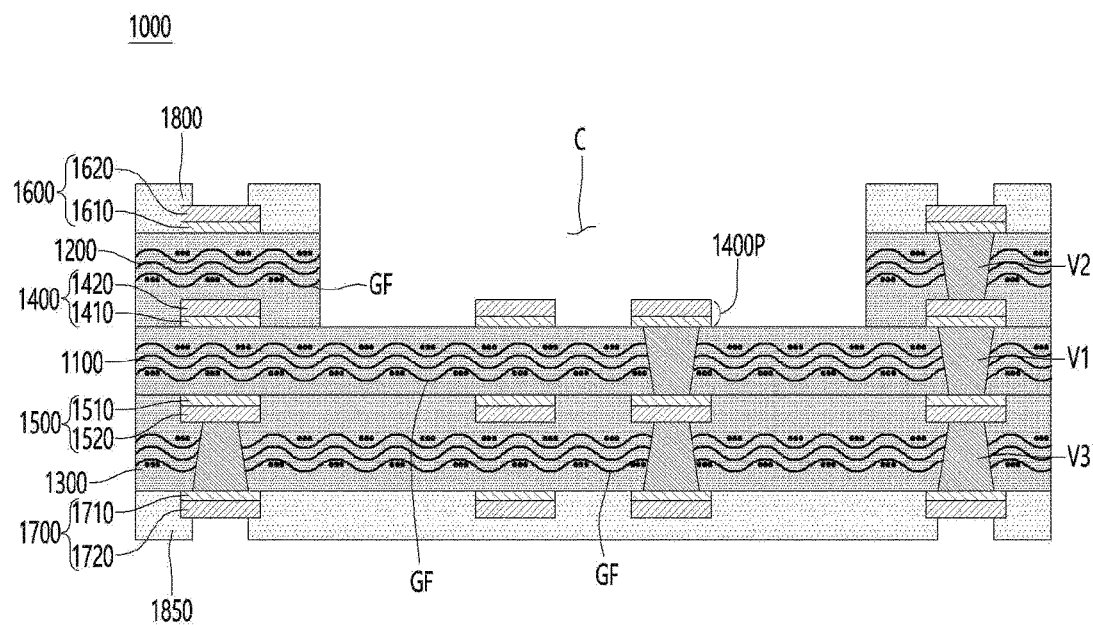

[FIG. 23A]
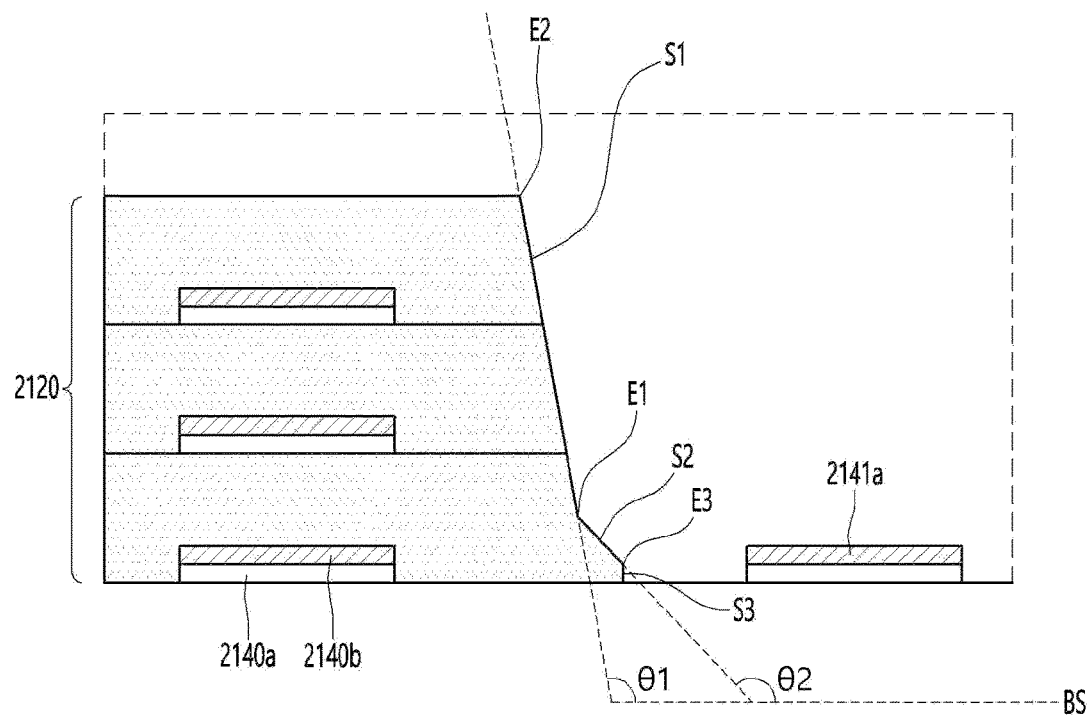

【FIG. 23B】
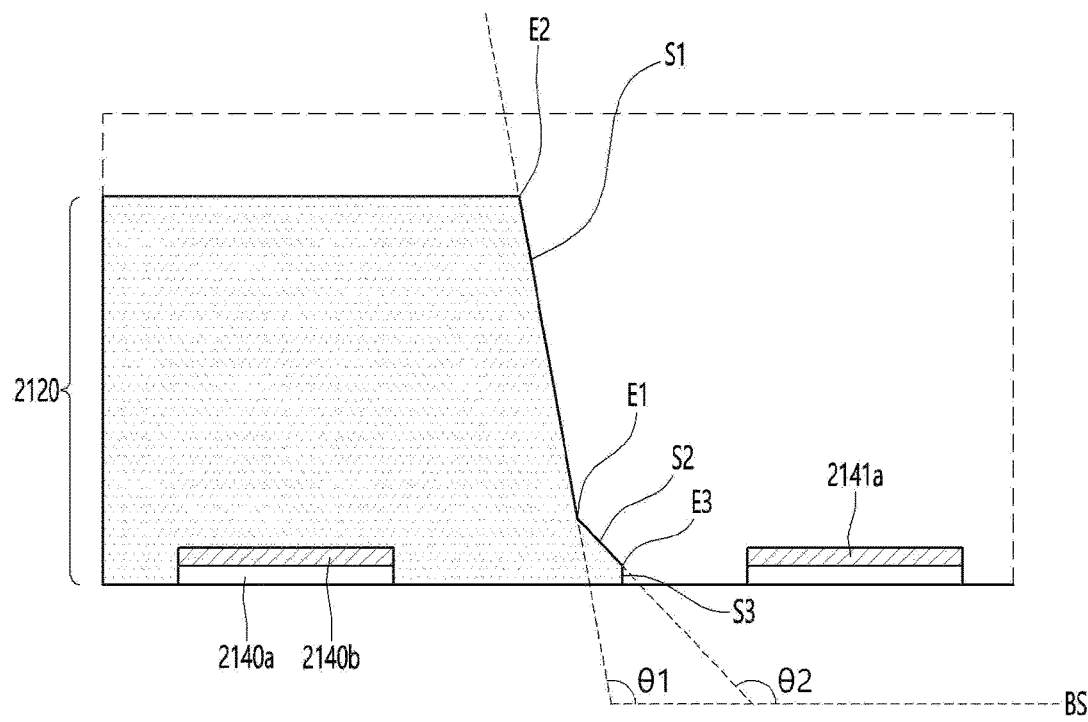

【FIG. 24】
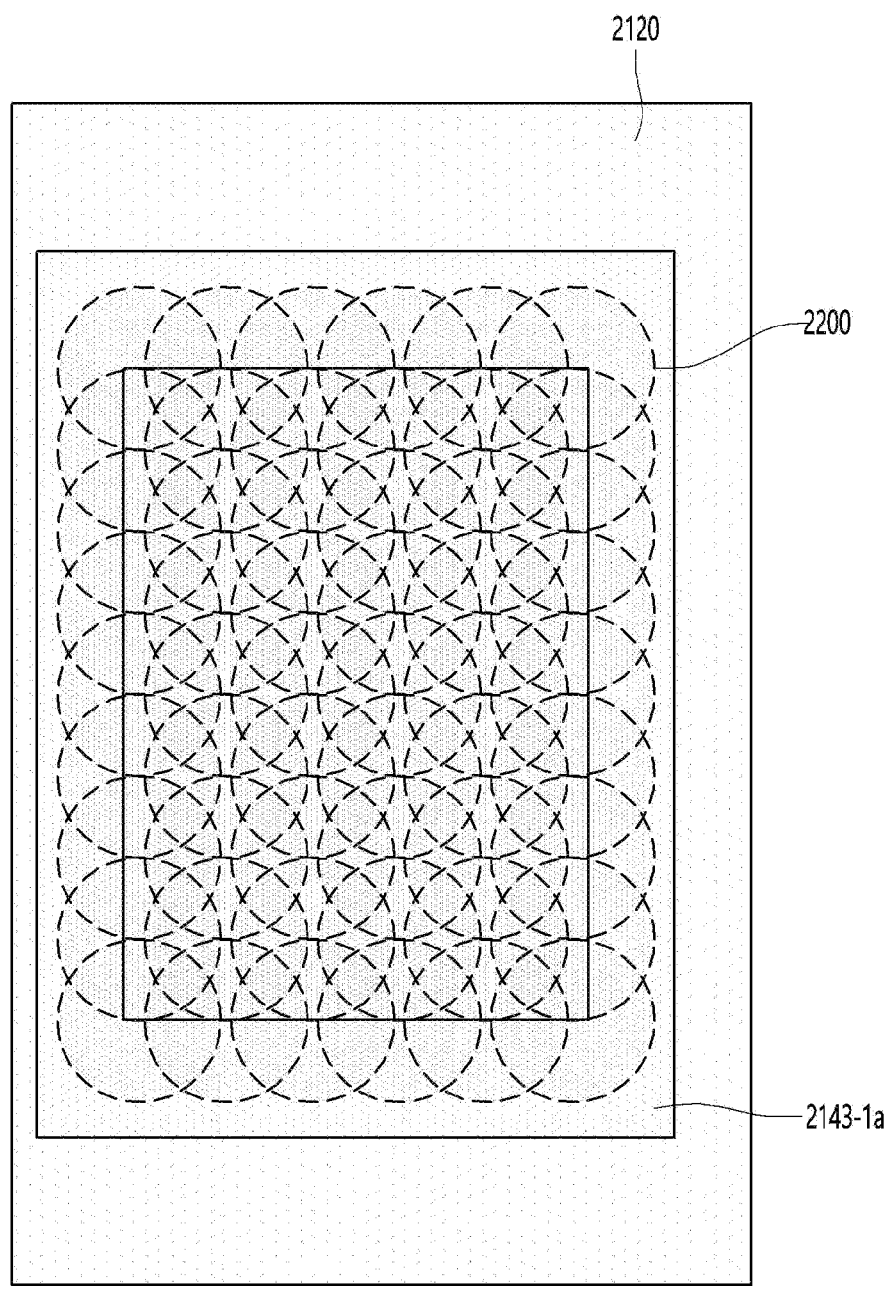

[FIG. 25]
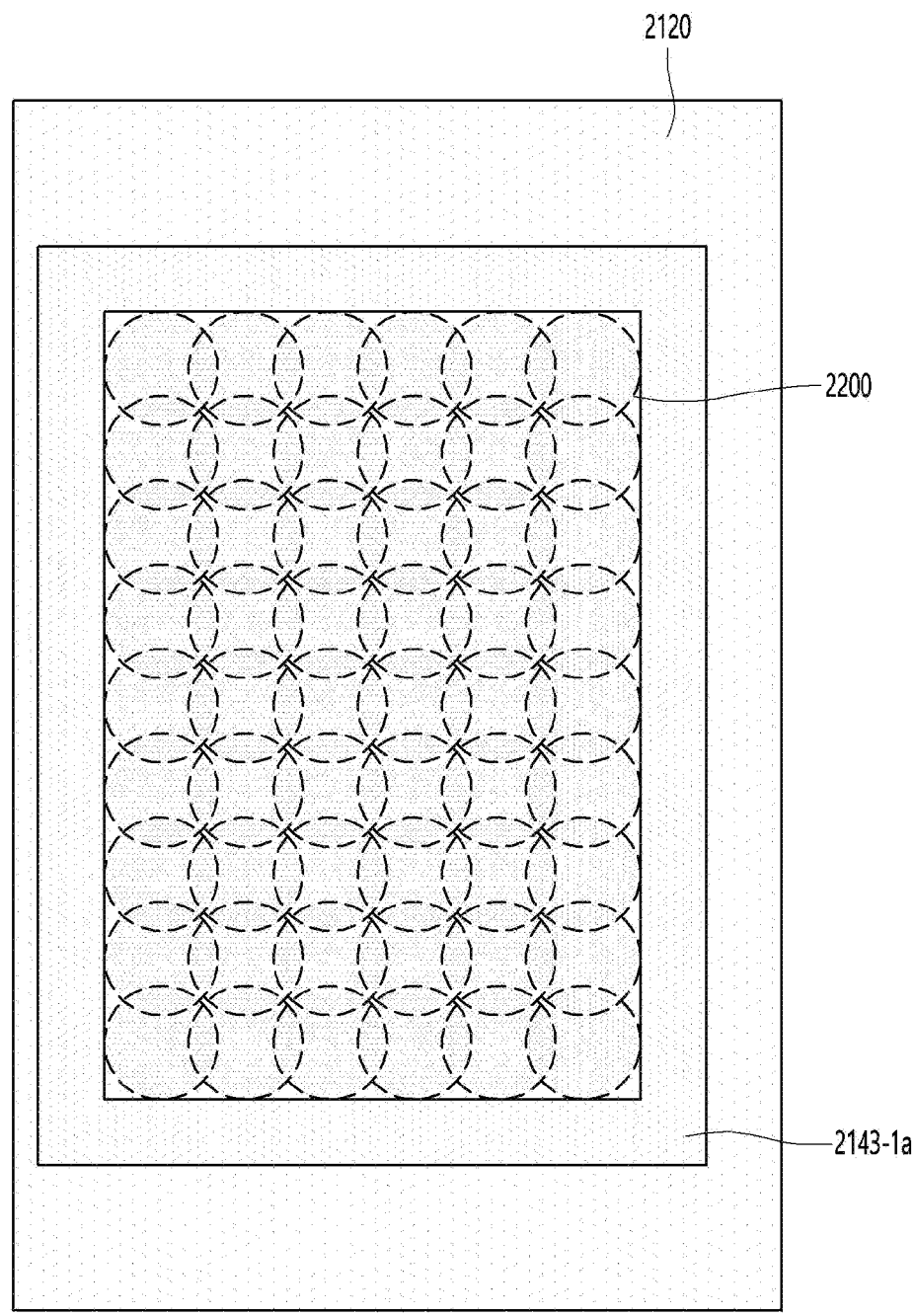

CIRCUIT BOARD

CROSS-REFERENCE TO RELATED PATENT APPLICATIONS

This application is a U.S. National Stage Application under 35 U.S.C. § 371 of PCT Application No. PCT/KR2021/008143, filed Jun. 29, 2021, which claims priority to Korean Patent Application Nos. 10-2020-0079192, 10-2020-0079232 and 10-2020-0079248, all filed Jun. 29, 2020, whose entire disclosures are hereby incorporated by reference.

TECHNICAL FIELD

The embodiment relates to a circuit board and a package board including the same.

BACKGROUND ART

The circuit board has a structure in which a mounting position of each element is determined in order to densely mount various kinds of elements on a flat plate and a circuit pattern connecting elements is printed on a surface of the flat plate and fixed. Such a circuit board may have an embedded structure in which the elements are embedded therein.

Recently, in order to realize miniaturization and multi-functionality of electronic components, the circuit board has been used in a multi-layered structure capable of high-density integration.

In general, a conventional embedded circuit board forms a cavity for embedding an element using a drill bit, uses an auxiliary material such as a release film for mounting the element, or uses sandblasting to form a cavity for embedding the element.

However, in a cavity included in the conventional circuit board, an inclination angle of an inner wall is formed to be 150° or more with respect to a bottom surface of the cavity. Accordingly, there is a problem that a space required for forming the cavity is relatively increased by considering the inclination angle of the inner wall in order to provide a mounting space for an element in the cavity. Accordingly, the conventional circuit board has a problem that the degree of integration of the circuit is reduced, and the overall volume of the circuit board increases as the space for forming the cavity increases.

DISCLOSURE

Technical Problem

An embodiment relates to a circuit board capable of improving an inclination angle of an inner wall of a cavity, a package substrate, and a method of manufacturing the same.

In addition, the embodiment is directed to providing a way a circuit board capable of forming a cavity having a desired depth in a desired region without additionally forming a necessary stop layer on a bottom surface of the cavity, a package substrate, and manufacturing thereof in a cavity forming process.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes: a first insulating layer; a first circuit pattern disposed on one surface of the first insulating layer and including a pad; and a second insulating layer disposed on the one surface of the first insulating layer and including a cavity exposing the pad, wherein the first circuit pattern includes a 1-1 metal layer disposed on the one surface of the first insulating layer and a 1-2 metal layer disposed on one surface of the 1-1 metal layer, an area of the 1-1 metal layer is greater than that of the 1-2 metal layer, and a side surface of at least a part of the 1-1 metal layer is exposed through the cavity.

In addition, the 1-1 metal layer includes a first portion vertically overlapping the 1-1 metal layer and a second portion other than the first portion, and a side surface of the second portion is exposed through the cavity.

In addition, the second portion of the 1-1 metal layer has a closed loop shape surrounding outside of the cavity and is disposed between the first insulating layer and the second insulating layer.

In addition, the 1-1 metal layer is a seed layer of the 1-2 metal layer.

In addition, an upper surface of the first portion of the 1-1 metal layer is in direct contact with a lower surface of the 1-2 metal layer, and an upper surface of the second portion of the 1-1 metal layer is in direct contact with the second insulating layer.

In addition, the second portion of the 1-1 metal layer is spaced apart from the 1-2 metal layer by a predetermined interval.

In addition, the first circuit pattern includes a 1-1 circuit pattern disposed in a region adjacent to the cavity and a 1-2 circuit pattern other than the 1-1 circuit pattern, wherein the 1-1 metal layer of the 1-2 circuit pattern and the 1-2 metal layer of the 1-2 circuit pattern have the same area, and the 1-1 metal layer of the 1-1 circuit pattern has an area larger than that of the 1-2 metal layer of the 1-1 circuit pattern.

In addition, the 1-1 metal layer of the 1-1 circuit pattern includes a first portion vertically overlapping the 1-2 metal layer of the 1-1 circuit pattern and a second portion other than the first portion, and a second portion of the 1-1 metal layer of the 1-1 circuit pattern surrounds outside of the cavity and is disposed between the first insulating layer and the second insulating layer.

In addition, the second insulating layer includes a 2-1 insulating layer and a 2-2 insulating layer, and the cavity passes through the 2-1 insulating layer and the 2-2 insulating layer in common.

In addition, the second insulating layer includes the 2-1 insulating layer and the 2-2 insulating layer and includes a second circuit pattern disposed between the 2-1 insulating layer and the 2-2 insulating layer, wherein the cavity includes a first cavity formed in the 2-1 insulating layer and a second cavity formed in the 2-2 insulating layer and having a different size from the first cavity, a side surface of at least a part of the 1-1 metal layer is exposed through the first cavity, the second circuit pattern includes a 2-1 metal layer disposed on one surface of the 2-1 insulating layer and a 2-2 metal layer disposed on one surface of the 2-1 metal layer, an area of the 2-1 metal layer is greater than that of the 2-2 metal layer, and a side surface of at least a part of the 2-1 metal layer is exposed through the second cavity.

In addition, a thickness of the second insulating layer has a range of 5 μm to 20 μm.

In addition, the second insulating layer includes resin coated copper (RCC).

Meanwhile, a package substrate according to an embodiment includes: a first insulating layer; a first circuit pattern disposed on one surface of the first insulating layer and including a pad; a second insulating layer disposed on the one surface of the first insulating layer and including a cavity exposing the pad; a connection part disposed on the pad; and an electronic element disposed on the connection part, wherein the first circuit pattern includes a 1-1 metal layer disposed on the one surface of the first insulating layer and a 1-2 metal layer disposed on one surface of the first-1-1 metal layer, an area of the 1-1 metal layer is greater than that of the 1-2 metal layer, the 1-1 metal layer includes a first portion vertically overlapping the 1-1 metal layer and a second portion other than the first portion, and a side surface of the second portion is exposed through the cavity.

In addition, the second portion of the 1-1 metal layer has a closed loop shape surrounding outside of the cavity and is disposed between the first insulating layer and the second insulating layer.

In addition, the first circuit pattern includes a 1-1 circuit pattern disposed in a region adjacent to the cavity and a 1-2 circuit pattern other than the 1-1 circuit pattern, wherein the 1-1 metal layer of the 1-2 circuit pattern and the 1-2 metal layer of the 1-2 circuit pattern have the same area, and the 1-1 metal layer of the 1-1 circuit pattern has an area larger than that of the 1-2 metal layer of the 1-1 circuit pattern.

In addition, the 1-1 metal layer of the 1-1 circuit pattern includes a first portion vertically overlapping the 1-2 metal layer of the 1-1 circuit pattern and a second portion other than the first portion, and a second portion of the 1-1 metal layer of the 1-1 circuit pattern surrounds outside of the cavity and is disposed between the first insulating layer and the second insulating layer.

In addition, the second insulating layer includes resin coated copper (RCC) having a thickness in a range of 5 μm to 20 μm.

In addition, a circuit board according to an embodiment includes: a first insulating layer; a first circuit pattern disposed on one surface of the first insulating layer and including a pad; and a second insulating layer disposed on the one surface of the first insulating layer and including a cavity exposing the pad, wherein an inclination angle of an inner wall of the cavity has a range of 90.1 degrees to 100 degrees with respect to an upper surface of the first insulating layer, the second insulating layer includes prepreg in which glass fibers are disposed in a resin, and the glass fibers of the second insulating layer do not protrude into the cavity.

In addition, a vertical cross section of the cavity has a rectangular or square shape.

In addition, a horizontal cross section of the cavity includes a curved surface.

In addition, the horizontal cross section of the cavity includes an edge portion having a predetermined curvature.

In addition, the curvature of the edge portion of the cavity corresponds to a curvature of a circle in a range of 20 μm to 80 μm.

A circuit board according to an embodiment includes: a first insulating layer; and a second insulating layer disposed on the first insulating layer and including a cavity, wherein the cavity is formed to pass through the second insulating layer, and an inner wall of the cavity is in contact with an upper surface of the first insulating layer and includes a first portion having a first inclination angle, a second portion extending from the first portion and having a second inclination angle different from the first inclination angle, and a third portion extending from the second portion and having a third inclination angle different from the second inclination angle.

The first inclination angle is smaller than the second and third inclination angles, the second inclination angle is greater than the first and third inclination angles, and the third inclination angle is greater than the first inclination angle and smaller than the second inclination angle.

The first inclination angle has a range of 89 degrees to 91 degrees, the second inclination angle has a range of 130 degrees to 160 degrees, and the third inclination angle has a range of 92 degrees to 130 degrees.

In addition, the cavity includes a first inflection point between the first and second portions of the inner wall and a second inflection point between the second and third portions of the inner wall.

In addition, the circuit board includes a pad disposed on the upper surface of the first insulating layer and exposed through the cavity, wherein the second inflection point is positioned lower than an upper surface of the pad.

In addition, the pad includes a first metal layer disposed on the upper surface of the first insulating layer and a second metal layer disposed on an upper surface of the first metal layer, and the first inflection point has the same height as the first metal layer.

In addition, a thickness of the second insulating layer has a range of 5 μm to 20 μm.

In addition, the second insulating layer includes resin coated copper (RCC).

In addition, surface roughness of the first portion of the inner wall of the cavity is different from surface roughness of the second portion or the third portion of the inner wall of the cavity.

Advantageous Effects

An embodiment may include a first circuit pattern disposed on an upper surface of a first insulating layer. The first circuit pattern may include a 1-1 metal layer as a seed layer and a 1-2 metal layer as a plating layer disposed on the 1-1 metal layer. In addition, in the embodiment, as a stop layer of a cavity C to be formed in a second insulating layer, the 1-1 metal layer, which is a seed layer of the 1-2 metal layer, is used. Accordingly, in the embodiment, an area of the 1-1 metal layer may be greater than that of the 1-2 metal layer. In addition, the 1-1 metal layer in the embodiment may include a first portion vertically overlapping the 1-2 metal layer and a second portion not overlapping the 1-2 metal layer. In addition, a side surface of a second portion of the 1-1 metal layer may be exposed through the cavity C formed in the second insulating layer. In addition, the second portion of the 1-1 metal layer may surround outside of the cavity C and may be disposed between the first insulating layer and the second insulating layer.

Accordingly, in the embodiment, it is not necessary to form an additional stop layer necessary for forming the cavity in the second insulating layer by using the laser process, thereby reducing the manufacturing cost and achieving simplification of the manufacturing process.

In addition, in the embodiment, the cavity is formed by performing two processing processes. For example, in the embodiment, primary processing is performed using a carbon dioxide ($CO_2$) laser and secondary processing is performed using an ultraviolet (UV) laser to form a cavity. That is, when the cavity is formed by the carbon dioxide ($CO_2$) laser, a step-shaped step is generated on an inner wall of the cavity to correspond to a movement interval of the laser source during laser processing. Accordingly, in the embodiment, the cavity formed by the carbon dioxide ($CO_2$) laser may be further processed using the ultraviolet (UV) laser. Accordingly, the inner wall of the cavity in the embodiment may be substantially perpendicular to a bottom surface of the cavity or a surface of the insulating layer. For example, the inner wall of the cavity may have an inclination angle of 90.01° to 100° with respect to the bottom surface of the cavity or the surface of the insulating layer. For example, the inner wall of the cavity may have an inclination angle of 90.1° to 95° with respect to the bottom surface of the cavity or the surface of the insulating layer. For example, the inner wall of the cavity may have an inclination angle of 91° to 93° with respect to the bottom surface of the cavity or the surface of the insulating layer. Through this, a vertical cross-sectional shape of the cavity in the embodiment may be close to a rectangle or a square. Accordingly, in the embodiment, a space occupied by the cavity in the insulating layer may be reduced, thereby improving the degree of integration of the circuit.

That is, a width of a lower region of the cavity C may be determined so that a size of the cavity C corresponds to a size of an electronic element to be disposed therein. In this case, in the comparative example, a width of the upper region of the cavity C is greater than that of the lower region of the cavity C, and space waste occurs as much as a space corresponding to a difference in width between the upper region and the lower region. For example, when using the carbon dioxide ($CO_2$) laser or the like as in the comparative example, the inclination angle of the inner wall of the cavity is 110° or more. In addition, in the comparative example, the size of the cavity may be significantly greater than a size of the electronic element due to the inclination angle of the inner wall of the cavity. Alternatively, in the embodiment, by making the inclination angle of the inner wall of the cavity close to a vertical angle, the size of the cavity can be reduced, and thus it is possible to solve waste of space.

In addition, at least a portion of the cavity C in the embodiment may include a rounded portion. For example, a shape of the cavity may have a shape including a rounded portion. For example, at least a portion of the cavity C in the embodiment may have a curved surface. For example, the cavity C in the embodiment may have a shape in which an edge portion has a curved surface. Accordingly, in the embodiment, it is possible to solve a problem that may occur as the edge portion of the cavity has a vertical straight line. For example, when the edge portion of the cavity has the vertical straight line, stress is concentrated in the edge portion, and structural reliability problems such as collapse of the cavity may be solved. On the other hand, in the embodiment, the structural reliability problem can be solved by making the edge portion of the cavity include a curved surface, thereby improving product satisfaction.

In addition, in the embodiment, the insulating layer in which the cavity is formed may be formed of prepreg. The prepreg may include glass fibers in the resin to ensure rigidity. In addition, in the process of forming the cavity C, a part of the glass fibers may be exposed to the outside through the cavity C. In addition, when the glass fibers are exposed through the cavity C, various reliability problems may occur. For example, a problem may occur in the flatness of the electronic element disposed in the cavity C due to the glass fibers. For example, an electrical short-circuit of the electronic element disposed in the cavity C may occur due to the glass fibers. Accordingly, in the embodiment, after a primary cavity processing is performed using the carbon dioxide ($CO_2$) laser, a secondary cavity processing is performed using the ultraviolet (UV) laser. In this case, the ultraviolet (UV) laser may remove the glass fibers exposed through the primary processed cavity while the inclination angle of the inner wall of the cavity C is almost vertical. That is, in the embodiment, in order to improve reliability of the cavity C, cavity processing using the ultraviolet (UV) laser is additionally performed. In this case, the ultraviolet (UV) laser may remove the glass fibers that may be exposed through the cavity. Accordingly, in the embodiment, the structural reliability of the cavity may be improved, and thus product reliability may be improved.

In addition, the circuit board of the embodiment includes a first insulating layer and a second insulating layer disposed on the first insulating layer. A cavity is formed in the second insulating layer. In this case, the inner wall of the cavity includes a first portion extending from an upper surface of the first insulating layer and having a first inclination angle, a second portion having a second inclination angle, and a third portion having a third inclination angle. In this case, the first to third inclination angles are different from each other. For example, a first inflection portion is formed between the first portion and the second portion of the inner wall of the cavity, and a second inflection portion is formed between the second portion and the third portion. In addition, the first inclination angle of the first portion may be smaller than the second inclination angle of the second portion. In addition, the second inclination angle of the second portion may be greater than the third inclination angle of the third portion. In addition, the third inclination angle of the third portion may be greater than the first inclination angle of the first portion and smaller than the second inclination angle of the second portion. In the above-described embodiment, the inclination angles of the first portion and the third portion may be formed to be smaller than those of the comparative example, and accordingly, a space required for forming the cavity may be minimized compared to the comparative example. Further, in the embodiment, the degree of integration of the circuit may be improved in the same space. Furthermore, in the embodiment, an average inclination angle of the inner wall of the cavity may be reduced compared to the comparative example, and accordingly, more circuits may be formed within the same area compared to the comparative example, and thus the overall volume of the circuit board may be reduced.

In addition, a package substrate in the embodiment includes a molding layer disposed in the cavity. In this case, the first portion, the second portion, and the third portion of the inner wall of the cavity are disposed in contact with each other. In this case, the first portion, the second portion, and the third portion of the inner wall of the cavity may have different inclination angles based on the first inflection portion and the second inflection portion instead of a single inclination angle. A structure of the cavity of the embodiment described above may increase a surface area in contact with the molding layer, and accordingly, adhesion between the molding layer and the circuit board may be improved.

In addition, in the embodiment, the cavity is formed using a mask pattern. In this case, the mask pattern includes a first mask pattern for determining a depth of the cavity in a lower region of the cavity and a second mask pattern disposed to surround a periphery of the cavity in an upper region of the cavity to determine an upper width of the cavity. In this case, in the comparative example, the first mask pattern and the second mask pattern were formed using separate metal layers. Alternatively, in the embodiment, the seed layer used to form the circuit pattern may be used as the first mask pattern and the second mask pattern. In this case, at least a part of the first mask pattern and the second mask pattern vertically overlaps. That is, the first mask pattern and the second mask pattern in the comparative example are disposed so as not to vertically overlap. Accordingly, in the comparative example, laser processing is performed to a region outside the second mask pattern due to a process deviation during laser processing, and accordingly, a problem that a part of the first insulating layer is processed may occur. Alternatively, in the embodiment, as described above, the cavity may be precisely processed in a cavity processing region by disposing the first mask pattern and the second mask pattern to partially overlap, thereby improving reliability.

DESCRIPTION OF DRAWINGS

FIG. 1 is a view showing a circuit board according to a first embodiment.

FIG. 2 is a plan view of a part of a configuration of FIG. 1.

FIG. 3 is a view showing a package substrate according to the first embodiment.

FIG. 4 is a view showing a package substrate according to a second embodiment.

FIGS. 5 to 10 are views showing a method of manufacturing the circuit board shown in FIG. 1 in order of process.

FIGS. 11 to 13 are views showing modified examples of the circuit board of FIG. 1.

FIG. 14 is a view showing a circuit board according to the second embodiment.

FIG. 15 is a plan view of a part of a configuration of the circuit board of FIG. 14.

FIGS. 16 to 22 are views showing a method of manufacturing the circuit board shown in FIG. 14 in order of process.

FIGS. 23A and 23B are views specifically showing a structure of a cavity according to a third embodiment.

FIG. 24 is a view for describing a method of processing a cavity according to the third embodiment.

FIG. 25 is a view for describing a method of processing a cavity according to a comparative example.

MODES OF THE INVENTION

Hereinafter, embodiments of the present invention will be described in detail with reference to the accompanying drawings.

However, the spirit and scope of the embodiment is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. In addition, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

Hereinafter, embodiments of the present invention will be described in detail with reference to the accompanying drawings.

FIG. 1 is a view showing a circuit board according to a first embodiment, and FIG. 2 is a plan view of a part of a configuration of FIG. 1.

Referring to FIG. 1, a circuit board 100 according to the first embodiment includes a first insulating layer 110, a second insulating layer 120, a third insulating layer 130, circuit patterns 140, 150, 160, and 170, vias V1, V2, and V3, and protective layers 180 and 185.

The first insulating layer 110 may be an insulating layer disposed in a center of the circuit board 100.

The second insulating layer 120 is disposed on the first insulating layer 110.

In addition, the third insulating layer 130 is disposed under the first insulating layer 110.

In this case, it is illustrated that the first insulating layer 110 is disposed at a center layer in an entire stacked structure of the circuit board 100 in the drawing, but the embodiment is not limited thereto. That is, in the entire stacked structure of the circuit board 100, the first insulating layer 110 may be disposed at a position biased toward an upper side or may be disposed at a position biased toward a lower side on the contrary.

Here, referring to FIG. 1, the second insulating layer 120 may be disposed on the first insulating layer 110. The second insulating layer 120 may be composed of a single layer. However, the embodiment is not limited thereto. For example, the second insulating layer 120 may have a plurality of layer structures. However, a cavity C may be formed in the second insulating layer 120 in the embodiment. In addition, when the second insulating layer 120 has the plurality of layer structures, the second insulating layer of the first layer shown in FIG. 1 may represent an insulating layer in which the cavity C is formed.

In addition, the third insulating layer 130 is disposed under the first insulating layer 110. In this case, the third insulating layer 130 may be composed of a single layer. However, the embodiment is not limited thereto. For example, the third insulating layer 130 may have a plurality of layer structures.

In addition, it is illustrated that the circuit board 100 has a three-layer structure based on a number of insulating layers in the drawings, the embodiment is not limited thereto. For example, the circuit board 100 may have a number of layers less than three layers based on the number of insulating layers or alternatively may have a number of layers greater than three layers.

The first insulating layer 110, the second insulating layer 120, and the third insulating layer 130 are substrates on which an electric circuit capable of changing wiring is formed and may include all of a printed circuit board, a wiring board, and an insulating board that are made of an insulating material capable of forming circuit patterns on a surface thereof.

For example, the first insulating layer 110 may be rigid or flexible. For example, the first insulating layer 110 may include glass or plastic. In detail, the first insulating layer 110 may include chemically tempered/semi-tempered glass such as soda lime glass or aluminosilicate glass, etc., a tempered or flexible plastic such as polyimide (PI), or polyethylene terephthalate (PET), propylene glycol (PPG), polycarbonate (PC), etc., or sapphire.

In addition, the first insulating layer 110 may include an optical isotropic film. As an example, the first insulating layer 110 may include cyclic olefin copolymer (COC), cyclic olefin polymer (COP), optical isotropic polycarbonate (PC), optical isotropic polymethyl methacrylate (PMMA), or the like.

In addition, the insulating layer 110 may be partially bent while having a curved surface. That is, the insulating layer 110 may partially have a plane and may partially be bent while having a curved surface. Specifically, an end portion of the insulating layer 110 may be bent while having a curved surface, or bent or crooked while having a surface with a random curvature.

In addition, the first insulating layer 110 may be a flexible substrate having a flexible characteristic. In addition, the first insulating layer 110 may be a curved or bent substrate.

Meanwhile, the second insulating layer 120 and the third insulating layer 130 may be composed of resin coated copper (RCC).

That is, when each of the second insulating layer 120 and the third insulating layer 130 is f composed of a single layer, each of the second insulating layer 120 and the third insulating layer 130 of the single layer may be composed of RCC. In addition, when each of the second insulating layer 120 and the third insulating layer 130 has a plurality of layer structures, each layer of the second insulating layer 120 having the plurality of layer structures and each layer of the third insulating layer 130 having the plurality of layer structures may be composed of RCC.

Accordingly, each of the second insulating layer 120 and the third insulating layer 130 may have a thickness of 5 μm to 20 μm. For example, each of the second insulating layer 120 and the third insulating layer 130 may have a thickness of 6 μm to 18 μm. Each of the second insulating layer 120 and the third insulating layer 130 may have a thickness of 7 μm to 15 μm.

In this case, when the second insulating layer 120 is formed of a plurality of layers, the thickness range may refer to a thickness range of each of the plurality of layers.

That is, the insulating layer constituting the circuit board in the comparative example was composed of a prepreg (PPG) including glass fibers. In this case, it is difficult to reduce a thickness of the glass fibers based on the PPG of the circuit board in the comparative example. This is because when a thickness of the PPG is reduced, the glass fibers included in the PPG may be electrically connected to a circuit pattern disposed on a surface of the PPG, and thus a crack list is induced. Accordingly, in the circuit board in the comparative example, when the thickness of the PPG is reduced, dielectric breakdown and circuit pattern damage may occur. Accordingly, the circuit board in the comparative example had a limit in reducing the overall thickness due to the thickness of the glass fibers constituting the PPG.

In addition, since the circuit board in the comparative example composed of the insulating layer of only PPG including the glass fibers, the circuit board has a high permittivity. However, in the case of a dielectric having a high permittivity, there is a problem that it is difficult to use as a substitute for a high frequency. That is, in the circuit board of the comparative example, since the permittivity of the glass fibers is high, a phenomenon in which the permittivity is broken in a high frequency band occurs.

Accordingly, in the embodiment, by constituting the insulating layer using an RCC having a low permittivity, it is possible to provide a highly reliable circuit board in which signal loss is minimized even in the high frequency band while reducing a thickness of the circuit board.

Meanwhile, as the second insulating layer 120 in the embodiment is composed of RCC, the thickness of the circuit board may be remarkably reduced compared to the comparative example in which the insulating layer is composed of PPG. Accordingly, in the embodiment, the thickness of the circuit board may be reduced by at least 5 μm compared to the comparative example by using RCC made of a low-permittivity material.

However, even though RCC having a low permittivity of 2.7, which is 10% improved from a level of 3.0 which is the permittivity of PPG, is used, a thickness reduction rate is only 10% compared to the comparative example. Therefore, in the embodiment, it is possible to provide an optimal circuit board by forming a cavity in a portion on which a chip such as an electronic element is mounted through laser processing.

In this case, at least one of the first insulating layer 110, the second insulating layer 120, and the third insulating layer 130 may represent an electrical wiring connecting circuit components based on the circuit design in a wiring figure and may reproduce electrical conductors on an insulating material. In addition, at least one of the first insulating layer 110, the second insulating layer 120, and the third insulating layer 130 may form wirings for mounting electrical components and connecting the electrical components to make a circuit and may mechanically fix components other than components that have an electrical connection function.

For example, a first circuit pattern 140 may be disposed on an upper surface of the first insulating layer 110. For example, a second circuit pattern 150 may be disposed on a lower surface of the first insulating layer 110. For example, a third circuit pattern 160 may be disposed on an upper surface of the second insulating layer 120. For example, a fourth circuit pattern 170 may be disposed on a lower surface of the third insulating layer 130.

Each of the first to fourth circuit patterns 140, 150, 160, and 170 may be formed in a plurality on the surface of each insulating layer while being spaced apart from each other by a predetermined interval.

In addition, when the second insulating layer 120 has a plurality of layer structures, the third circuit patterns 160 may be respectively disposed on surfaces of a plurality of second insulating layers. In addition, when the third insulating layer 130 has a plurality of layer structures, the fourth circuit patterns 170 may be respectively disposed on surfaces of a plurality of third insulating layers.

Meanwhile, the first to fourth circuit patterns 140, 150, 160, and 170 as described above may be wirings that transmit electrical signals and may be formed of a metal material having high electrical conductivity. To this end, the first to fourth circuit patterns 140, 150, 160, and 170 may be formed of at least one metal material selected from among gold (Au), silver (Ag), platinum (Pt), titanium (Ti), tin (Sn), copper (Cu), and zinc (Zn). In addition, the first to fourth circuit patterns 140, 150, 160, and 170 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the first to fourth circuit patterns 140, 150, 160, and 170 may be formed of copper (Cu) having high electrical conductivity and a relatively low cost.

The first to fourth circuit patterns 140, 150, 160, and 170 may be formed by a general process of manufacturing a circuit board, such as an additive process, a subtractive process, a modified semi additive process (MSAP), a semi additive process (SAP), etc., and detailed descriptions thereof will be omitted herein.

Meanwhile, the first circuit pattern 140 may include a pad 140P that is disposed on the upper surface of the first insulating layer 110 and is exposed through the cavity C. The pad 140P may be electrically connected to an electronic element mounted in the cavity C (to be described later). For example, the pad 140P may be a wire bonding pad connected to the electronic element mounted in the cavity C through a wire. Alternatively, the pad 140P may be a flip-chip bonding pad directly connected to a terminal of the electronic element mounted in the cavity C.

Meanwhile, each of the first to fourth circuit patterns 140, 150, 160, and 170 may include a via pad connected to a via for interlayer conduction, a trace for signal transmission, and a mounting pad connected to an electronic element, etc.

Here, the first to fourth circuit patterns 140, 150, 160, and 170 may have a plurality of layer structures.

For example, the first circuit pattern 140 may include a 1-1 metal layer 141 and a 1-2 metal layer 142. The 1-1 metal layer 141 may be disposed on the upper surface of the first insulating layer 110. For example, a lower surface of the 1-1 metal layer 141 may be in direct contact with the upper surface of the first insulating layer 110. The 1-1 metal layer 141 may be a chemical copper plating layer. For example, the 1-1 metal layer 141 may be an electroless plating layer. The 1-1 metal layer 141 may be a seed layer for electroplating the 1-2 metal layer 142. The 1-2 metal layer 142 may be an electrolytic plating layer formed by electroplating the 1-1 metal layer 141 as a seed layer. A thickness of the 1-2 metal layer 142 may be greater than that of the 1-1 metal layer 141. For example, the 1-1 metal layer 141 may have a first thickness. The first thickness of the 1-1 metal layer 141 may vary depending on a plating method of the 1-1 metal layer 141. For example, the chemical copper plating layer may be divided into heavy copper plating (Heavy Copper, 2 μm or more), medium copper plating (Medium Copper, 1 to 2 μm), and light copper plating (Light Copper, 1 μm or less) depending on the thickness. In this case, the 1-1 metal layer 141 in the embodiment may have a first thickness satisfying 0.5 μm to 1.5 μm by the medium copper plating or the light copper plating. The 1-2 metal layer 142 may have a range of 8.5 μm to 13.5 μm. Accordingly, a total thickness of the first circuit pattern 140 including the 1-1 metal layer 141 and the 1-2 metal layer 142 may be in a range of 10 μm to 14 μm.

For example, the second circuit pattern 150 may include a 2-1 metal layer 151 and a 2-2 metal layer 152. The 2-1 metal layer 151 may be disposed on the lower surface of the first insulating layer 110. For example, an upper surface of the 2-1 metal layer 151 may be in direct contact with the lower surface of the first insulating layer 110. The 2-1 metal layer 151 may be a chemical copper plating layer. For example, the 2-1 metal layer 151 may be an electroless plating layer. The 2-1 metal layer 151 may be a seed layer for electroplating the 2-2 metal layer 152. The 2-2 metal layer 152 may be an electrolytic plating layer formed by electroplating the 2-1 metal layer 151 as a seed layer. A thickness of the 2-2 metal layer 152 may be greater than that of the 2-1 metal layer 151.

For example, the third circuit pattern 160 may include a 3-1 metal layer 161 and a 3-2 metal layer 162. The 3-1 metal layer 161 may be disposed on the upper surface of the second insulating layer 120. For example, a lower surface of the 3-1 metal layer 161 may be in direct contact with the upper surface of the second insulating layer 120. The 3-1 metal layer 161 may be a chemical copper plating layer. For example, the 3-1 metal layer 161 may be an electroless plating layer. The 3-1 metal layer 161 may be a seed layer for electroplating the 3-2 metal layer 162. The 3-2 metal layer 162 may be an electrolytic plating layer formed by electroplating the 3-1 metal layer 161 as a seed layer. A thickness of the 3-2 metal layer 162 may be greater than that of the 3-1 metal layer 161.

For example, the fourth circuit pattern 170 may include a 4-1 metal layer 171 and a 4-2 metal layer 172. The 4-1 metal layer 171 may be disposed on the lower surface of the third insulating layer 130. For example, an upper surface of the 4-1 metal layer 171 may be in direct contact with the lower surface of the third insulating layer 130. The 4-1 metal layer 171 may be a chemical copper plating layer. For example, the 4-1 metal layer 171 may be an electroless plating layer. The 4-1 metal layer 171 may be a seed layer for electroplating the 4-2 metal layer 172. The 4-2 metal layer 172 may be an electrolytic plating layer formed by electroplating the 4-1 metal layer 171 as a seed layer. A thickness of the 4-2 metal layer 172 may be greater than that of the 4-1 metal layer 171.

Vias V1, V2, and V3 for electrically connecting circuit patterns disposed on different layers to each other may be disposed in the first insulating layer 110, the second insulating layer 120, and the third insulating layer 130. The vias V1, V2, and V3 may be disposed to pass through at least one of the first insulating layer 110, the second insulating layer 120, and the third insulating layer 130. In addition, both ends of the vias V1, V2, and V3 are respectively connected to circuit patterns disposed on different insulating layers, and thus an electrical signal may be transmitted.

A first via V1 may be disposed on the first insulating layer 110. The first via V1 may be disposed to pass through the upper surface and the lower surface of the first insulating layer 110. The first via V1 may electrically connect the first circuit pattern 140 disposed on the upper surface of the first insulating layer 110 and the second circuit pattern 150 disposed on the lower surface of the first insulating layer 110.

A second via V2 may be disposed on the second insulating layer 120. The second via V2 may be disposed to pass through the upper surface and the lower surface of the second insulating layer 120. The second via V2 may electrically connect the first circuit pattern 140 disposed on the upper surface of the first insulating layer 110 and the third circuit pattern 160 disposed on the upper surface of the second insulating layer 120.

A third via V3 may be disposed on the third insulating layer 130. The third via V3 may be disposed to pass through the upper surface and the lower surface of the third insulating layer 130. The third via V3 may electrically connect the second circuit pattern 150 disposed on the lower surface of the first insulating layer 110 and the fourth circuit pattern 170 disposed on the lower surface of the third insulating layer 130.

Meanwhile, the vias V1, V2, and V3 may pass through only one insulating layer among the first insulating layer 110, the second insulating layer 120, and the third insulating layer 130. A plurality of insulating layers may be disposed to pass through in common. Accordingly, the vias V1, V2, and V3 may connect circuit patterns disposed on the surface of the insulating layer spaced apart by at least two or more layers to each other rather than an insulating layer adjacent to each other.

Meanwhile, the vias V1, V2, and V3 may be formed by filling an inside of a through-hole (not shown) passing through at least one of the plurality of insulating layers with a conductive material.

The through-hole may be formed by any one of mechanical, laser, and chemical processing. When the through-hole is formed by mechanical processing, a method such as milling, drilling and routing may be used, when the through-hole is formed by laser processing, a method of UV or $CO_2$ laser may be used, when the through-hole is formed by chemical processing, at least one insulating layer among the plurality of insulating layers may be opened by using a chemical including aminosilane, ketones, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulation layer, and the $CO_2$ laser is a laser capable of processing only an insulation layer.

When the through-hole is formed, the vias V1, V2, and V3 may be formed by filling the inside of the through-hole with a conductive material. The metal material forming the vias V1, V2, and V3 may be any one selected from among copper (Cu), silver (Ag), tin (Sn), gold (Au), nickel (Ni), and palladium (Pd), and the conductive material may be filled by any one of electroless plating, electroplating, screen printing, sputtering, evaporation, ink jetting, and dispensing, or a combination thereof.

Meanwhile, the protective layers 180 and 185 may be disposed on a surface of an insulating layer disposed at the uppermost and lowermost sides among the first insulating layer 110, the second insulating layer 120, and the third insulating layer 130. For example, a first protective layer 180 may be disposed on an upper surface of an insulating layer disposed on the uppermost portion among the plurality of insulating layers. For example, the first protective layer 180 may be disposed on the upper surface of the second insulating layer 120. In addition, a second protective layer 185 may be disposed on a lower surface of an insulating layer disposed at the lowermost portion among the plurality of insulating layers. For example, the second protective layer 185 may be disposed on the lower surface of the third insulating layer 130.

Each of the first protective layer 180 and the second protective layer 185 may have an opening. For example, the first protective layer 180 may have an opening exposing a surface of the third circuit pattern to be exposed among the third circuit patterns 160 disposed on the upper surface of the second insulating layer 120.

In addition, the second protective layer 185 may have an opening exposing a surface of the fourth circuit pattern to be exposed among the fourth circuit patterns 170 disposed on the lower surface of the third insulating layer 130.

The first protective layer 180 and the second protective layer 185 may include an insulating material. The first protective layer 180 and the second protective layer 185 may include various materials that may be cured by heating after applying to protect the surface of the circuit patterns. The first protective layer 180 and the second protective layer 185 may be a resist layer. For example, the first protective layer 180 and the second protective layer 185 may be a solder resist layer including an organic polymer material. For example, the first protective layer 180 and the second protective layer 185 may include an epoxy acrylate-based resin. In detail, the first protective layer 180 and the second protective layer 185 may include a resin, a curing agent, a photoinitiator, a pigment, a solvent, a filler, an additive, an acryl-based monomer, and the like. However, the embodiment is not limited thereto, and the first protective layer 180 and the second protective layer 185 may be any one of a photo-solder resist layer, a cover-lay, and a polymer material.

The first protective layer 180 and the second protective layer 185 may have a thickness of 1 μm to 20 μm. The first protective layer 180 and the second protective layer 185 may have a thickness of 1 μm to 15 μm. For example, the first protective layer 180 and the second protective layer 185 may have a thickness of 5 μm to 20 μm. When the thickness of the first protective layer 180 and the second protective layer 185 exceeds 20 μm, a thickness of the circuit board 100 may increase. When the thickness of the first protective layer 180 and the second protective layer 185 is less than 1 μm, the reliability of circuit patterns included in the circuit board 100 may be deteriorated.

Meanwhile, a cavity C may be formed in the second insulating layer 120. In this case, the cavity C may be formed in the second insulating layer 120 composed of a plurality of layers, or alternatively, the cavity C may be formed to pass through the second insulating layer 120 composed of a single layer.

Accordingly, in the embodiment, the pad 140P among the first circuit patterns 140 disposed on the upper surface of the first insulating layer 110 may be exposed through the cavity C. The cavity C may provide a space for mounting an electronic element. In addition, the pad 140P may be exposed through the cavity C to be electrically connected to the electronic element mounted in the cavity C.

The cavity C in the embodiment may be formed through a laser process. In this case, in order to form the cavity C through the laser process, a stop layer is required for processing the insulating layer only to a desired depth. The stop layer may be formed of a metal material that is not processed by the laser. For example, the laser may be a laser capable of processing only the insulating layer. In addition, the laser may not be able to process a metal layer formed of a metal material. Accordingly, in a general circuit board, a stop layer for preventing the laser from passing through a cavity forming region is provided. In this case, the stop layer in the general circuit board may be formed through an additional process unlike the circuit pattern. Accordingly, in the related art, a process of forming the stop layer and a process of removing the stop layer after the cavity is formed have to be additionally performed, and accordingly, there are problems such as an increase in manufacturing cost and complexity of the manufacturing process.

Alternatively, in the embodiment, a part of the circuit pattern may be used as the stop layer without forming a separate stop layer in a region where the cavity C is to be formed.

In the embodiment, a part of the first circuit pattern 140 is used as the stop layer. Preferably, in the embodiment, the 1-1 metal layer 141 constituting the first circuit pattern 140 may be used as the stop layer for forming the cavity C.

That is, the 1-1 metal layer 141 may be removed after forming the 1-2 metal layer 142. In other words, the 1-1 metal layer 141 before being removed may be entirely formed on the upper surface of the first insulating layer 110.

In addition, in the general circuit board, after the 1-2 metal layer is formed, all the 1-1 metal layer formed in a region that does not vertically overlap the 1-2 metal layer are removed.

Alternatively, in the embodiment, after the 1-2 metal layer 142 is formed, the 1-1 metal layer 141 is not all removed, and the 1-1 metal layer 141 existing in the region where the cavity C is to be formed is left.

In addition, in the embodiment, when the cavity C is formed, a process of additionally removing the 1-1 metal layer 141 in a region exposed through the cavity C is performed. That is, in the embodiment, the 1-1 metal layer 141, which is the seed layer of the 1-2 metal layer 142, may be used as the stop layer for forming the cavity C. Accordingly, in the embodiment, it is possible to omit a process of additionally forming the stop layer necessary for forming the cavity C, thereby reducing the manufacturing cost and achieving the simplification of the manufacturing process.

In this case, in the embodiment, it is difficult to accurately leave the 1-1 metal layer 141 only in the region where the cavity C is to be formed after the 1-2 metal layer 142 is formed. That is, tolerances in the laser process or product design tolerances exist, and accordingly, it is practically impossible to leave the 1-1 metal layer 141 only in the region where the cavity C is to be formed. Therefore, a region where the 1-1 metal layer 141 is left without being removed may be greater than an actual region where the cavity C is to be formed.

Accordingly, in the embodiment, a side surface of the 1-1 metal layer 141 used as the stop layer may be exposed through a sidewall of the cavity C.

That is, in the embodiment, the 1-1 metal layer 141 may include a first portion disposed in a region that vertically overlaps the 1-2 metal layer 142.

In addition, in the embodiment, the 1-1 metal layer 141 may include a second portion 141a disposed in a region that does not vertically overlap the 1-2 metal layer 142, and as shown in FIG. 2, the second portion 141a of the 1-1 metal layer 141 may have a structure disposed to surround outside of the cavity C.

In this case, the second portion 141a of the 1-1 metal layer 141 in the first embodiment may be separated from the 1-2 metal layer 142. In other words, the second portion 141a of the 1-1 metal layer 141 in the first embodiment may be electrically insulated from the 1-2 metal layer 142 constituting the first circuit pattern 140. In other words, the second portion 141a of the 1-1 metal layer 141 in the first embodiment may be disposed to be spaced apart from the 1-2 metal layer 142 constituting the first circuit pattern 140 by a predetermined interval. In addition, the second portion 141a of the 1-1 metal layer 141 in the first embodiment may be disposed to surround outside of the cavity C in a region adjacent to the cavity C.

Accordingly, the 1-1 metal layer 141 in the first embodiment may have a different area from that of the 1-2 metal layer 142. That is, in a general circuit board, a seed layer and a plating layer disposed on the seed layer may have the same area. This is because, the seed layer in a region where the plating layer is not disposed is completely removed after the plating layer is formed. Accordingly, the seed layer and the plating layer in the general circuit board may have the same area as each other.

Alternatively, the 1-1 metal layer 141 in the embodiment may have an area greater than that of the 1-2 metal layer 142. For example, the 1-1 metal layer 141 may have an area greater than that of the 1-2 metal layer 142 by the second portion 141a.

Meanwhile, in the embodiment, the cavity C may be formed using a Gaussian beam. In this case, the outermost portion of the cavity C may be processed using a center point of the Gaussian beam. That is, a laser having greatest intensity is generated at the center point of the Gaussian beam, and accordingly, the inclination angle of the inner wall of the cavity C in the outermost portion may be smaller than that of the comparative example.

As described above, in the embodiment, the first circuit pattern 140 disposed on the upper surface of the first insulating layer 110 is included. The first circuit pattern 140 may include the 1-1 metal layer 141 as the seed layer and the 1-2 metal layer 142 as the plating layer disposed on the 1-1 metal layer 141. In addition, in the embodiment, the 1-1 metal layer 141 which is the seed layer of the 1-2 metal layer 142 is used as the stop layer of the cavity C to be formed in the second insulating layer 120. Accordingly, an area of the 1-1 metal layer 141 in the embodiment may be greater than that of the 1-2 metal layer 142. In addition, in the embodiment, the 1-1 metal layer 141 may include the first portion vertically overlapping the 1-2 metal layer 142 and the second portion 141a not overlapping the 1-2 metal layer 142. In addition, a side surface of the second portion 141a of the 1-1 metal layer 141 may be exposed through the cavity C formed in the second insulating layer 120. In addition, the second portion 141a of the 1-1 metal layer 141 may surround outside of the cavity C and may disposed between the first insulating layer 110 and the second insulating layer 120. Accordingly, in the embodiment, it is not necessary to form an additional stop layer necessary for forming the cavity in the second insulating layer by using the laser process, thereby reducing the manufacturing cost and achieving simplification of the manufacturing process.

Hereinafter, focusing on the structure of the circuit board in the first embodiment, a package substrate including the same and a method of manufacturing the same will be described.

FIG. 3 is a view showing a package substrate according to the first embodiment.

Referring to FIG. 3, a package substrate 200A according to the embodiment includes the circuit board 100 shown in FIG. 1 and an electronic element 190 mounted in a cavity C of the circuit board 100.

The circuit board 100 described with reference to FIGS. 1 and 2 may be used as a package board 200A for mounting the electronic element 190.

In this case, since the circuit board 100 has already been described in detail above, a description thereof will be omitted.

The circuit board 100 includes a cavity C, and a pad 140P that is a part of a first circuit pattern 140 may be exposed in the cavity C. In addition, 1-1 metal layer 141 having a closed-loop shape surrounding outside of the cavity C may be disposed in the cavity C. In this case, it is illustrated that the closed-loop shape of the 1-1 metal layer 141 in FIG. 2 is a quadrangular shape, but the embodiment is not limited thereto. For example, the closed-loop shape of the 1-1 metal layer 141 may be circular, and alternatively, it may be deformed into various shapes such as a triangular shape, a polygonal shape, and an elliptical shape.

In this case, the electronic element 190 may be an electronic component disposed in the cavity C of the circuit board 100 and may be divided into an active element and a passive element. In addition, the active element is an element that actively uses non-linear characteristics, and the passive element refers to an element that does not use the non-linear characteristic even though both linear and non-linear characteristics are present. In addition, the active element may include a transistor, an IC semiconductor chip, and the like, and the passive element may include a capacitor, a resistor, an inductor, and the like. The passive element is mounted on a conventional circuit board to increase a signal processing speed of a semiconductor chip which is an active element, or to perform a filtering function.

Meanwhile, a connection part 195 may be disposed on the pad 140P. A planar shape of the connection part 195 may be a quadrangle. The connection part 195 is disposed on the pad 140P and electrically connects the electronic element 190 and the pad 140P while fixing the electronic element 190. To this end, the connection part 195 may be formed of a conductive material. As an example, the connection part 195 may be a solder ball. The connection part 195 may include a heterogeneous material in solder. The solder may be composed of at least one of SnCu, SnPb, and SnAgCu. In addition, the heterogeneous material may include any one of Al, Sb, Bi, Cu, Ni, In, Pb, Ag, Sn, Zn, Ga, Cd, and Fe.

Meanwhile, an upper surface of the electronic element 190 may be positioned higher than a surface of the uppermost layer of the circuit board 100. However, the embodiment is not limited thereto, and according to the type of the electronic element 190, the upper surface of the electronic element 190 may be disposed at the same height as the surface of the uppermost layer of the circuit board 100 or may be disposed to be lower than this.

FIG. 4 is a view showing a package substrate according to a second embodiment.

Referring to FIG. 4, a package substrate 200B according to the embodiment includes a circuit board 100 and an electronic element 190a mounted in a cavity C of the circuit board 100.

In addition, the package substrate 200B is disposed in the cavity C and further includes a molding layer M covering the electronic element 190a.

The molding layer M may be selectively disposed in the cavity C to protect the electronic element 190a mounted in the cavity C.

The molding layer M may be composed of a resin for molding, for example, epoxy molding compound (EMC). However, the embodiment is not limited thereto, and the molding layer M may be composed of various other molding resins in addition to EMC.

The circuit board 100 may be used as the package substrate 200B for mounting the electronic element 190a.

In addition, as described above, a connection part 195a may be disposed between the electronic element 190a and the pad 140P.

Hereinafter, a method of manufacturing a circuit board according to an embodiment will be described with reference to the accompanying drawings.

FIGS. 5 to 10 are views showing a method of manufacturing the circuit board shown in FIG. 1 in order of process.

Referring to FIG. 5, a first insulating layer 110 may be prepared, first and second circuit patterns 140 and 150 may be formed on a surface of the first insulating layer 110, and a first via V1 passing through the first insulating layer 110 and electrically connecting the first and second circuit patterns 140 and 150 may be formed.

The first insulating layer 110 may be prepreg. The prepreg (PPG) has good flowability and adhesion in a semi-cured state, is used as an intermediate substrate for a fiber-reinforced composite material used as an adhesive layer and an insulating material layer, and is a molding material in which a matrix resin is impregnated in reinforced fibers in advance. A molded article is formed by curing the resin by stacking and heating/pressing such prepregs. That is, the prepreg refers to a material that is impregnated with resin (BT/Epoxy, FR4, FR5, etc.) into glass fiber and cured to B-stage.

That is, the first insulating layer 110 may be a thermosetting or thermoplastic polymer substrate, a ceramic substrate, an organic-inorganic composite substrate, or a glass fiber-impregnated substrate, and when the first insulating layer 110 includes a polymer resin, an epoxy-based insulating resin may be included, and alternatively, the polyimide-based resin may be included.

In this case, the first circuit pattern 140 and the second circuit pattern 150 may be composed of a plurality of layers.

For example, the first circuit pattern 140 may include a 1-1 metal layer 141 and a 1-2 metal layer 142. For example, the second circuit pattern 150 may include a 2-1 metal layer 151 and a 2-2 metal layer 152.

Briefly describing a process of forming the first circuit pattern 140, in the embodiment, a process of forming the 1-1 metal layer 141 on the surface of the first insulating layer 110 by electroless plating may be performed. Thereafter, in the embodiment, a process of forming a mask on the 1-1 metal layer 141 may be performed. Thereafter, in the embodiment, the mask may be exposed and developed to form an opening exposing a region where the 1-2 metal layer 142 is to be formed. Thereafter, in the embodiment, the 1-2 metal layer 142 filling the opening may be formed by electroplating the 1-1 metal layer 141 as a seed layer. Meanwhile, the first circuit pattern 140 may include a pad 140P exposed through a cavity C while being electrically connected to an electronic element later.

Next, referring to FIG. 6, in the embodiment, when the 1-2 metal layer 142 and the 2-2 metal layer 152 are formed, a process of removing the 1-1 metal layer 141 and the 2-1 metal layer 151 used as seed layers thereof may be performed.

In this case, in the embodiment, the entire metal layer used as the seed layer is not removed, and the metal layer disposed in the region where the cavity C is to be formed is left without being removed.

Specifically, the cavity C may be formed in a second insulating layer 120 disposed on the 1-1 metal layer 141. Accordingly, in the embodiment, a portion of the 1-1 metal layer 141 corresponding to a region CR where the cavity C is to be formed is left without being removed.

That is, in general, all portions of the 1-1 metal layer 141 that do not vertically overlap the 1-2 metal layer 142 are removed. In this case, in the embodiment, in the 1-1 metal layer 141, a portion positioned in the region where the cavity C is to be formed among the portions that do not vertically overlap the 1-2 metal layer 142 is left without being removed.

In this case, the remaining portion of the 1-1 metal layer 141 may be greater than the cavity C to be actually formed. Accordingly, in the embodiment, a problem that a part of the surface of the first insulating layer 110 is removed due to a process error occurring in the process of forming the cavity C is solved.

Next, as shown in FIG. 7, in the embodiment, the second insulating layer 120 is formed on an upper surface of the first insulating layer 110. In addition, in the embodiment, a third insulating layer 130 is formed under a lower surface of the first insulating layer 110. In this case, each of the second insulating layer 120 and the third insulating layer 130 may be composed of RCC.

In addition, a process of forming a circuit pattern on a surface of the second insulating layer 120 may be performed. For example, a process of forming a third circuit pattern 160 on an upper surface of the second insulating layer 120 may be performed.

In addition, a process of forming a circuit pattern on a surface of the third insulating layer 130 may be performed. For example, a process of forming a fourth circuit pattern 170 on a lower surface of the third insulating layer 130 may be performed.

The third circuit pattern 160 and the fourth circuit pattern 170 may also have a plurality of layer structures, respectively.

For example, the third circuit pattern 160 may include a 3-1 metal layer 161 and a 3-2 metal layer 162. For example, the fourth circuit pattern 170 may include a 4-1 metal layer 171 and a 4-2 metal layer 172.

In addition, in the embodiment, a process of forming a second via V2 in the second insulating layer 120 may be performed. In addition, in the embodiment, a process of forming a third via V3 in the third insulating layer 130 may be performed.

Next, referring to FIG. 8, in the embodiment, a process of forming the cavity C may be performed by opening the second insulating layer 120 using a laser.

In this case, the 1-1 metal layer 141 is not removed is present on the upper surface of the first insulating layer 110 in the region where the cavity C is to be formed.

In addition, in the embodiment, by using the 1-1 metal layer 141 left in the region where the cavity C is to be formed in the laser process as a stop layer, a process of removing the insulating layer may be performed only up to a region where the 1-1 metal layer 141 is formed.

In this case, in the embodiment, the process of forming the cavity C may be performed using the center line of the Gaussian beam. That is, in the embodiment, the outermost region of the cavity C is processed by using the beam of the center line of the Gaussian beam. In addition, in the embodiment, the entire region of the cavity C is processed while moving the Gaussian beam by a predetermined distance.

Next, referring to FIG. 9, in the embodiment, a process of removing the 1-1 metal layer 141 whose upper surface is exposed through the cavity C may be performed. For example, in the embodiment, a process of removing the 1-1 metal layer 141 exposed through the cavity C by etching may be performed.

Next, referring to FIG. 10, in the embodiment, a process of forming protective layers 180 and 185 on the upper surface of the second insulating layer 120 and the lower surface of the third insulating layer 130 may be performed, respectively.

Each of the first protective layer 180 and the second protective layer 185 may have an opening. For example, the first protective layer 180 may have an opening exposing the surface of the third circuit pattern to be exposed among the third circuit patterns 160 disposed on the upper surface of the second insulating layer 120.

In addition, the second protective layer 185 may have an opening exposing the surface of the fourth circuit pattern to be exposed among the fourth circuit patterns 170 disposed on the lower surface of the third insulating layer 130.

FIGS. 11 to 13 are views showing modified examples of the circuit board of FIG. 1.

Referring to FIG. 11, only the structure of the first circuit pattern 140 in the circuit board 100A is different from that of the circuit board according to the first embodiment of FIG. 1, and accordingly, characteristics of the circuit board 100A will be mainly described below.

In the first embodiment, the 1-1 metal layer 141 disposed around the cavity C has a structure separate from the 1-2 metal layer 142.

Alternatively, the first circuit pattern may include a 1-1 circuit pattern 140*b* disposed adjacent to the cavity C. In addition, the first circuit pattern may include a 1-2 circuit pattern other than the 1-1 circuit pattern 140*b*. In addition, the 1-1 metal layer and the 1-2 metal layer of the 1-2 circuit pattern may have the same area or width. Alternatively, the 1-1 metal layer and the 1-2 metal layer of the 1-1 circuit pattern may have different areas or widths.

That is, the 1-1 circuit pattern 140*b* may include a 1-1 metal layer 141*b* and a 1-2 metal layer 142*b*. In this case, the 1-1 metal layer 141*b* may be formed on the first insulating layer 110 to have a first width. In addition, the 1-2 metal layer 142*b* may be disposed on the 1-1 metal layer 141*b* to have a second width. In this case, the first width may be greater than the second width. Therefore, the 1-1 metal layer 141*b* may include a first portion vertically overlapping the 1-2 metal layer 141*b* and a second portion not vertically overlapping the 1-2 metal layer 142*b*. In this case, an upper surface of the first portion of the 1-1 metal layer 141*b* may be in direct contact with the 1-2 metal layer 142*b*. In addition, an upper surface of the second portion of the 1-1 metal layer 141*b* may be disposed in direct contact with the second insulating layer 120, unlike the first portion.

In addition, the second portion of the 1-1 metal layer 141*b* may be positioned adjacent to the cavity C compared to the first portion of the 1-1 metal layer 141*b*.

In addition, a side surface of the second portion of the 1-1 metal layer 141*b* may be exposed through the cavity C. Alternatively, the 1-2 metal layer 142*b* has a smaller width than the 1-1 metal layer 141*b* and is disposed on the 1-1 metal layer 141*b* at a position away from the cavity C, and thus the 1-2 metal layer 142*b* may not be exposed through the cavity C.

Referring to FIG. 12, the circuit board may have a different layer structure of an insulating layer compared to the circuit board of FIG. 1.

That is, in FIG. 1, each the second insulating layer 120 and the third insulating layer 130 is composed of a single layer, but in the circuit board in FIG. 12, each of the second insulating layer 120 and the third insulating layer 130 may have a plurality of layer structures.

For example, the second insulating layer may include a 2-1 insulating layer 120-1 and a 2-2 insulating layer 120-2. In addition, each of the 2-1 insulating layer 120-1 and the 2-2 insulating layer 120-2 may be composed of RCC.

In addition, the third insulating layer may include a 3-1 insulating layer 130-1 and a 3-2 insulating layer 130-2. In addition, each of the 3-1 insulating layer 130-1 and the 3-2 insulating layer 130-2 may be composed of RCC.

In addition, in the embodiment, the third circuit pattern may include a 3-1 circuit pattern 160-1 disposed on an upper surface of the 2-1 insulating layer 120-1 and a 3-2 circuit pattern 160-2 disposed on an upper surface of the 2-2 insulating layer 120-2.

In addition, in the embodiment, the fourth circuit pattern may include a 4-1 circuit pattern 170-1 disposed under a lower surface of the 3-1 insulating layer 130-1 and a 4-2 circuit pattern 170-2 disposed under a lower surface of the 3-2 insulating layer 130-2.

In addition, in the embodiment, the cavity C may be formed to pass through the second insulating layer 120 having the plurality of layer structures.

In this case, the cavity C may commonly pass through the second insulating layer 120 to form one cavity. For example, the cavity C may include a first cavity part C-1 formed in the 2-1 insulating layer 120-1 and a second cavity part C-2 formed in the 2-2 insulating layer 120-2. In addition, the first cavity part C-1 and the second cavity part C-2 may have the same width.

Accordingly, the 3-2 circuit pattern 160-2 disposed on the upper surface of the 2-2 insulating layer 120-2 may not be exposed through the cavity C, and only a pad corresponding to the 3-1 circuit pattern 160-1 disposed on the upper surface of the 2-1 insulating layer 120-1 may be exposed.

In this case, a metal layer corresponding to a stop layer used for forming the cavity C in the embodiment may be positioned only on the first insulating layer 110 and the 2-1 insulating layer 120-1. That is, the metal layer corresponding to the stop layer may have the same structure as the metal layer shown in any one of FIGS. 1 and 11 and may include the second portion 141*a* of the 1-1 metal layer 141 surrounding outside of the cavity C.

Referring to FIG. 13, the second insulating layer may include a 2-1 insulating layer 120-1 and a 2-2 insulating layer 120-2. In addition, each of the 2-1 insulating layer 120-1 and the 2-2 insulating layer 120-2 may be composed of RCC.

In addition, the third insulating layer may include a 3-1 insulating layer 130-1 and a 3-2 insulating layer 130-2. In addition, each of the 3-1 insulating layer 130-1 and the 3-2 insulating layer 130-2 may be composed of RCC.

In addition, in the embodiment, the third circuit pattern may include a 3-1 circuit pattern 160-1 disposed on an upper surface of the 2-1 insulating layer 120-1 and a 3-2 circuit pattern 160-2 disposed on an upper surface of the 2-2 insulating layer 120-2.

In addition, in the embodiment, the fourth circuit pattern may include a 4-1 circuit pattern 170-1 disposed under a lower surface of the 3-1 insulating layer 130-1 and a 4-2 circuit pattern 170-2 disposed under a lower surface of the 3-2 insulating layer 130-2.

In addition, in the embodiment, the cavity C may be formed to pass through the second insulating layer 120 having the plurality of layer structures.

In this case, the cavity C may include two each passing through the plurality of second insulating layers 120. For example, the cavity C may include a first cavity part C1 formed in the 2-1 insulating layer 120-1 and a second cavity C2 formed in the 2-2 insulating layer 120-2.

The first cavity C1 and the second cavity C2 may have different widths, respectively. For example, in the package substrate according to the embodiment, a first electronic element may be mounted in the first cavity C1 formed in the 2-1 insulating layer 120-1 and a second electronic element may be mounted in the second cavity C2 formed in the 2-2 insulating layer 120-2.

Accordingly, a part of the first circuit pattern (a pad connected to the first electronic element) may be exposed in the first cavity C1 formed in the 2-1 insulating layer 120-1, and a part of the 3-1 circuit pattern 160-1 may be exposed in the second cavity C2 formed in the 2-2 insulating layer 120-2.

In addition, the first cavity C1 and the second cavity C2 may have different widths. Accordingly, in the embodiment, the process of forming each cavity may be performed separately.

In this case, the metal layer corresponding to the stop layer used for forming the cavity C in the embodiment may be positioned not only between the first insulating layer 110 and the 2-1 insulating layer 120-1 but also between the 2-1 insulating layer 120-1 and the 2-2 insulating layer 120-2.

That is, a plating layer 160-1*a*, which is a part of the third-first circuit pattern 160-1 used to form the second cavity C2, may be disposed on the upper surface of the 2-1 insulating layer 120-1 to surround a periphery of the second cavity C2.

FIG. 14 is a view showing a circuit board according to the second embodiment, and FIG. 15 is a plan view of a part of a configuration of the circuit board of FIG. 14.

Compared to the first embodiment of FIG. 1, the circuit board according to the second embodiment may not include the second portion 141*a* of the 1-1 metal layer 141. Unlike the first embodiment, the circuit board according to the second embodiment may be achieved by performing a plurality of processing processes to form the cavity.

However, the circuit board of the second embodiment of FIG. 14 may also include the second portion 141*a* of the 1-1 metal layer 141 shown in FIGS. 1, 11, 12 and 13. However, hereinafter, it will be described that the second portion 141*a* of the 1-1 metal layer 141 is not included in the circuit board of the second embodiment.

Referring to FIG. 14, a circuit board 1000 includes a first insulating layer 1100, a second insulating layer 1200, a third insulating layer 1300, circuit patterns 1400, 1500, 1600, and 1700, vias V1, V2, and V3, and protective layers 1800 and 1850.

In this case, the second insulating layer 120 of the first embodiment was formed of RCC. Alternatively, the second insulating layer 1200 of the second embodiment may be formed of the same prepreg as the first insulating layer 1100. In this case, the prepreg may include glass fibers therein. In addition, when the cavity is formed in the prepreg, at least a part of the glass fibers included in the prepreg may be exposed into the cavity. In addition, the exposed glass fibers may cause various reliability problems described above. Accordingly, in the second embodiment, even when the second insulating layer 1200 is composed of the prepreg including glass fibers, the glass fibers exposed through the cavity may be completely removed. However, the embodiment is not limited thereto, and the second insulating layer 1200 in the second embodiment may also be formed of RCC as in the second insulating layer 120 in the first embodiment.

However, hereinafter, it will be described that the second insulating layer 1200 of the second embodiment is formed of a prepreg.

In this case, a cavity C described later may be formed in the second insulating layer 1200. The cavity C may be formed to pass through the second insulating layer 1200. In addition, in the embodiment, the second insulating layer 1200 is formed of a prepreg. Here, the prepreg may have a structure in which glass fibers and fillers are dispersed in a resin. In addition, when the cavity C is formed in the second insulating layer 1200 composed of the prepreg, a problem that the glass fibers dispersed in the second insulating layer 1200 are exposed through the cavity C may occur. Accordingly, the embodiment intends to provide a cavity formation method capable of efficiently removing glass fibers exposed through the cavity C among the glass fibers disposed in the second insulating layer 1200 and a cavity structure thereby.

This may be achieved by features appearing in a process of forming the cavity C to be described later. For example, in the embodiment, a plurality of processing processes are performed to form the cavity C. That is, when a laser is used to form the cavity C, a shape of the cavity, process time, and the like vary depending on the laser source. In this case, in the embodiment, while having an optimal cavity shape, a cavity in which the glass fibers are not exposed through the cavity C may be formed within a process time for optimal cavity formation.

In addition, a first circuit pattern 1400 may be disposed on an upper surface of the first insulating layer 1100. For example, a second circuit pattern 1500 may be disposed on a lower surface of the first insulating layer 1100. For example, a third circuit pattern 1600 may be disposed on an upper surface of the second insulating layer 1200. For example, a fourth circuit pattern 1700 may be disposed on a lower surface of the third insulating layer 1300.

Meanwhile, the first circuit pattern 1400 may include a pad 1400P exposed through the cavity C while being disposed on the upper surface of the first insulating layer 1100.

In addition, like the first embodiment, the circuit patterns in the second embodiment may have a two-layer structure. For example, the first circuit pattern 1400 may include a 1-1 metal layer 1410 and a 1-2 metal layer 1420. For example, the second circuit pattern 1500 may include a 2-1 metal layer 1510 and a 2-2 metal layer 1520. For example, the third circuit pattern 1600 may include a 3-1 metal layer 1610 and a 3-2 metal layer 1620. For example, the fourth circuit pattern 1700 may include a 4-1 metal layer 1710 and a 4-2 metal layer 1720.

The vias V1, V2, and V3 for electrically connecting circuit patterns disposed on different layers may be disposed in the first insulating layer 1100, the second insulating layer 1200, and the third insulating layer 1300.

Meanwhile, a cavity C may be formed in the second insulating layer 1200. In this case, the cavity C may be formed in the second insulating layer 1200 composed of a plurality of layers, and alternatively, the cavity C may be formed to pass through the second insulating layer 1200 composed of a single layer.

Accordingly, in the embodiment, the pad 1400P among the first circuit patterns 1400 disposed on the upper surface of the first insulating layer 1100 may be exposed through the cavity C.

In the embodiment, a part of the first circuit pattern 1400 is used as a stop layer in the cavity forming process. Preferably, in the embodiment, the 1-1 metal layer 1410 constituting the first circuit pattern 1400 may be used as the stop layer for forming the cavity C.

Meanwhile, in the embodiment, a mask (not shown) is required to precisely perform laser processing only on the region where the cavity C is to be formed. The mask may determine a size of a region to be processed by the laser. In other words, the mask may determine the size of the cavity C. The mask may be formed in a region corresponding to an upper region of the cavity C to determine a size of the upper region. For example, the mask may have a shape surrounding the upper region of the cavity. Therefore, the mask may determine the size of the upper region of the cavity and further may determine the overall size of the cavity C.

Additionally, the stop layer may determine a depth of the cavity C. That is, the stop layer may be disposed in a region corresponding to a lower region of the cavity C. Therefore, the stop layer may allow the processing of the insulating layer by the laser only up to a position corresponding to the lower region of the cavity C.

In this case, the mask in the embodiment may use a circuit pattern disposed on the upper surface of the second insulating layer 1200. Preferably, the mask in the embodiment may use a seed layer of the circuit pattern disposed on the upper surface of the second insulating layer 1200. More preferably, the mask in the embodiment may use the 3-1 metal layer 1610 constituting the third circuit pattern 1600 disposed on the upper surface of the second insulating layer 1200.

That is, in the embodiment, after forming the first circuit pattern 1400 and the third circuit pattern 1600, the cavity C may be formed in the second insulating layer 1200 by using the 1-1 metal layer 1410 of the first circuit pattern 1400 in the region where the cavity C is to be formed and the 3-1 metal layer 1610 of the third circuit pattern 1400.

Meanwhile, in the embodiment, laser processing may be performed in two steps so as to form the cavity C in the second insulating layer 1200.

Preferably, in the embodiment, the cavity may be primarily formed in the second insulating layer 1200 by using a carbon dioxide ($CO_2$) laser. The carbon dioxide ($CO_2$) laser has an advantage of rapidly forming a cavity of a desired size in the second insulating layer 1200 compared to other lasers but has a disadvantage that an inclination angle of the inner wall of the cavity C forms an obtuse angle with respect to a bottom surface of the cavity. That is, the inner wall of the cavity formed using the carbon dioxide laser has an angle of 110 degrees or more. In addition, when the inclination angle of the inner wall of the cavity C forms an obtuse angle, a lot of space is required to form the cavity C of a desired size. That is, the size of the cavity C may be substantially determined by the size of the lower region in which the electronic element is disposed. However, when the inner wall of the cavity C has an obtuse angle, a size of the upper region becomes greater than that of the lower region of the cavity C. Accordingly, the space required to form the cavity C may be increased by the size of the upper region rather than the size of the lower region.

Accordingly, in the embodiment, secondary processing may be performed using an ultraviolet (UV) laser on the cavity formed by the carbon dioxide ($CO_2$) laser. That is, when the cavity is formed by the carbon dioxide ($CO_2$) laser, a step-shaped step is generated on the inner wall of the cavity to correspond to a movement interval of the laser source during laser processing. Accordingly, in the embodiment, the cavity formed by the carbon dioxide ($CO_2$) laser may be secondary processed using the ultraviolet (UV) laser. Specifically, the secondary processing of the cavity using the ultraviolet (UV) laser may be performed only on the inner wall of the cavity that has been primarily processed.

Therefore, in the embodiment, the inclination angle of the inner wall of the secondary processed final cavity C may have an inclination angle of 90.01° to 100° with respect to the bottom surface of the cavity or the surface of the insulating layer. For example, the inner wall of the secondary-processed final cavity may have an inclination angle of 90.1° to 95° with respect to the bottom surface of the cavity or the surface of the insulating layer. For example, the inner wall of the cavity may have an inclination angle of 91° to 93° with respect to the bottom surface of the cavity or the surface of the insulating layer. That is, the cavity in the embodiment may be substantially perpendicular (or close to perpendicular) to the bottom surface of the cavity or the upper surface of the first insulating layer.

For example, a vertical cross-sectional shape of the cavity C formed in the second insulating layer 1200 in the embodiment may be close to a rectangular or square. Accordingly, in the embodiment, as the vertical cross-sectional shape of the cavity formed in the second insulating layer 1200 has a shape corresponding to a rectangle or a square, the space required to form the cavity C may be reduced, thereby improving the degree of integration of the circuit.

Specifically, the upper region of the cavity C in the embodiment may have a first width W1. In addition, in the embodiment, the lower region of the cavity C may have a second width W2 equal to the first width W1. Accordingly, in the embodiment, the space required to form the cavity C may be remarkably reduced.

A width of a lower region of the cavity C may be determined so that a size of the cavity C corresponds to a size of an electronic element to be disposed therein. In this case, in the comparative example, a width of the upper region of the cavity C is greater than that of the lower region of the cavity C, and waste of space occurs as much as a space corresponding to a difference in width between the upper region and the lower region. Alternatively, in the embodiment, the widths of the lower region and the upper region of the cavity C are the same, and thus it is possible to solve the waste of space.

Meanwhile, a horizontal cross section of the cavity C in the embodiment may have a shape in which at least a portion thereof is rounded. For example, at least a portion of the cavity C in the embodiment may have a curved surface. For example, the cavity C in the embodiment may have a shape in which an edge portion has a curved surface.

Referring to FIG. 15, the horizontal cross section of the cavity C in the embodiment includes at least four straight line portions.

For example, the horizontal cross section of the cavity C in the embodiment may include a first portion S1 having a straight line-shape. In addition, the horizontal cross section of the cavity C in the embodiment may include a second portion S2 of a straight line-shape that is substantially perpendicular to the first portion S1. In addition, the horizontal cross section of the cavity C in the embodiment may include a third portion S3 of a straight line-shape that is parallel to the first portion S1 and substantially perpendicular to the second portion S2. Have. In addition, the horizontal cross section of the cavity C in the embodiment may include a fourth portion S4 in a straight line-shape that is substantially perpendicular to the third portion S3 and parallel to the second portion S2.

In addition, the horizontal cross section of the cavity C may include a first edge E1 between the first portion S1 and the second portion S2. In this case, the first edge E1 may have a curve rather than a straight line. For example, the first edge E1 may be a rounding region. That is, the first edge E1 may include a curved surface.

In addition, the horizontal cross section of the cavity C may include a second edge E2 between the second portion S2 and the third portion S3. In this case, the second edge E2 may have a curve rather than a straight line. For example, the second edge E2 may be a rounding region. That is, the second edge E2 may include a curved surface.

In addition, the horizontal cross section of the cavity C may include a third edge E3 between the third portion S3 and the fourth portion S4. In this case, the third edge E3 may have a curve rather than a straight line. For example, the third edge E3 may be a rounding region. That is, the third edge E3 may include a curved surface.

In addition, the horizontal cross section of the cavity C may include a fourth edge E4 between the first portion S1 and the fourth portion S4. In this case, the fourth edge E4 may have a curve rather than a straight line. For example, the fourth edge E4 may be a rounding region. That is, the fourth edge E4 may include a curved surface.

In this case, the curved surfaces of the first edge E1, the second edge E2, the third edge E3, and the fourth edge E4 in the embodiment may correspond to a beam size of the ultraviolet (UV) laser in the embodiment. For example, the beam size of the ultraviolet (UV) laser may be a circular shape having a diameter of 20 μm to 80 μm. The first edge E1, the second edge E2, the third edge E3, and the fourth edge E4 may have curved surfaces corresponding to the beam size of the ultraviolet (UV) laser. For example, curvatures of the curved surfaces of the first edge E1, the second edge E2, the third edge E3, and the fourth edge E4 may correspond to a curvature of a circle having a diameter of 20 μm to 80 μm.

Accordingly, in the embodiment, as the first edge E1, the second edge E2, the third edge E3, and the fourth edge E4 have a vertical straight line, a structural reliability problem such as cavity collapse may be solved, thereby improving product satisfaction.

Meanwhile, in the embodiment, the second insulating layer 1200 may be formed of prepreg. The prepreg may include glass fibers in the resin to ensure rigidity. In addition, in the process of forming the cavity C, a part of the glass fibers may be exposed to the outside through the cavity C. In addition, when the glass fibers are exposed through the cavity C, various reliability problems may occur. For example, a problem may occur in the flatness of the electronic element disposed in the cavity C due to the glass fibers. For example, an electrical short-circuit of the electronic element disposed in the cavity C may occur due to the glass fibers.

In this case, the carbon dioxide ($CO_2$) laser may not remove the glass fibers included in the second insulating layer 1200. Accordingly, when the cavity C is formed only by the carbon dioxide ($CO_2$) laser, the glass fibers included in the second insulating layer 1200 may be exposed to the outside through the cavity C.

However, in the embodiment, after the primary cavity processing is performed using the carbon dioxide ($CO_2$) laser, the secondary cavity processing is performed using the ultraviolet (UV) laser. In this case, the ultraviolet (UV) laser may remove the glass fibers exposed through the primary processed cavity while the inclination angle of the inner wall of the cavity C is almost vertical.

That is, in the embodiment, all of the glass fibers of the second insulating layer 1200 that may protrude into the cavity C may be removed using the ultraviolet (UV) laser. Accordingly, the glass fibers of the second insulating layer 1200 may not protrude from the inner wall of the cavity C inward the cavity C.

FIGS. 16 to 22 are views showing a method of manufacturing the circuit board shown in FIG. 14 in order of process.

Referring to FIG. 16, a first insulating layer 1100 may be prepared, first and second circuit patterns 1400 and 1500 may be formed on a surface of the first insulating layer 1100, and a first via V1 passing through the first insulating layer 1100 and electrically connecting the first and second circuit patterns 1400 and 1500 may be formed.

Next, referring to FIG. 17, in the embodiment, when the 1-2 metal layer 1420 and the 2-2 metal layer 1520 are formed, a process of removing the 1-1 metal layer 1410 and the 2-1 metal layer 1510 used as a seed layer thereof may be performed.

In this case, in the embodiment, the entire metal layer used as the seed layer is not removed, and the metal layer disposed in the region where the cavity C is to be formed is left without being removed.

In this case, the 1-1 metal layer 1410 may include a 1-1 portion P1-1 vertically overlapping the 1-2 metal layer 1420 in a region where the cavity is not formed. In addition, the 1-1 metal layer 1410 may include a 1-2 portion P1-2 not vertically overlapping the 1-2 metal layer 1420 in a region where the cavity is not formed. In addition, the 1-1 metal layer 1410 may include a 1-3 portion P1-3 (1410*a*) disposed in the region where the cavity is formed.

In the embodiment, as the 1-2 metal layer 1420 is plated, when the manufacturing of the first circuit pattern 1400 is completed, the 1-2 portion P1-2 of the 1-1 metal layer 1410 is removed, and the 1-3 portion P1-3 of the 1-1 metal layer 1410 is left without being removed.

Next, as shown in FIG. 18, in the embodiment, the second insulating layer 1200 is formed on an upper surface of the first insulating layer 1100. In addition, in the embodiment, the third insulating layer 1300 is formed under a lower surface of the first insulating layer 1100. In this case, the second insulating layer 1200 and the third insulating layer 1300 may be composed of RCC, or alternatively, may be formed of prepreg.

In addition, a process of forming a circuit pattern on a surface of the second insulating layer 1200 may be performed. For example, a process of forming a third circuit pattern 1600 on an upper surface of the second insulating layer 1200 may be performed.

In addition, in an embodiment, a process of forming a second via V2 in the second insulating layer 1200 may be performed. In addition, in an embodiment, a process of forming a third via V3 in the third insulating layer 1300 may be performed.

Meanwhile, in the embodiment, the third circuit pattern 1600 disposed on the upper surface of the second insulating layer 1200 includes a 3-1 metal layer 1610 and a 3-2 metal layer 1620.

In this case, in a manufacturing process of the third circuit pattern 1600, when the plating of the 3-2 metal layer 1620 is completed, the 3-1 metal layer 1610 used as a plating seed layer of the 3-2 metal layer 1620 is removed. In this case, in the embodiment, the entire 3-1 metal layer 1610 used as the seed layer of the 3-2 metal layer 1620 is not removed, and the metal layer disposed in the region where the cavity C is to be formed is left without being removed.

Specifically, in the embodiment, a portion of the 3-1 metal layer 1610 disposed in an outer region of the cavity surrounding the region where the cavity C is to be formed is left without being removed. That is, in general, after the third circuit pattern 1600 is formed, in the 3-1 metal layer 1610, all portions that do not vertically overlap the 3-2 metal layer 1620 are removed. In this case, in the embodiment, in the 3-1 metal layer 1610, a portion positioned around the region where the cavity C is to be formed among the portions that do not vertically overlap the 3-2 metal layer 1620 is left without being removed.

Specifically, the 3-1 metal layer 1610 may be entirely formed on the upper surface of the second insulating layer 1200.

In this case, the 3-1 metal layer 1610 may include a 2-1 portion P2-1 vertically overlapping the 3-2 metal layer 1620. In addition, the 3-1 metal layer 1610 may include a portion that does not vertically overlap with the 3-2 metal layer 1620 in the region where the cavity is not formed. In this case, the portion that does not vertically overlap the 3-2 metal layer 1620 in the 3-1 metal layer 1610 may include a 2-2 portion P2-2 that overlaps the region where the cavity C is to be formed or is spaced apart from the region where the cavity C is to be formed. In addition, the portion that does not vertically overlap the 3-2 metal layer 1620 in the 3-1 metal layer 1610 may include a 2-3 portion P2-3 adjacent to the cavity region where the cavity C is to be formed.

Here, in a manufacturing process of the general circuit board, as the 3-2 metal layer 1620 is plated, when the manufacturing of the third circuit pattern 1600 is completed, the 3-1 metal layer 1610 including the 2-2 portion P2-2 and the 2-3 portion P2-3 is removed.

Alternatively, in the embodiment, in the manufacturing process of the general circuit board, as the 3-2 metal layer 1620 is plated, when the manufacturing of the second circuit pattern 1600 is completed, the 2-2 portion P2-2 of the 3-1 metal layer 1610 is removed and the 2-3 portion P2-3 of the 3-1 metal layer 1410 is left without being removed.

The 2-3 portion P2-3 of the 3-1 metal layer 1610 may be positioned in boundary region between the region where the cavity C is to be formed and the other regions on the upper surface of the second insulating layer 1200. For example, the 2-3 portion P2-3 of the 3-1 metal layer 1610 may be formed in a remaining region except for the region where the cavity C is to be formed on the upper surface of the second insulating layer 1200. For example, the 2-3 portion P2-3 of the 3-1 metal layer 1610 may be disposed to surround the region where the cavity C is to be formed on the upper surface of the second insulating layer 1200.

In this case, the 2-3 portion P2-3 of the 3-1 metal layer 1610 may have a predetermined width. In this case, a width of the 2-3 portion P2-3 of the 3-1 metal layer 1610 may be greater than a radius of a beam size in a subsequent laser process. That is, in the embodiment, a process of cavity processing may be performed using a Gaussian beam corresponding to a central portion of a beam in a laser process using the carbon dioxide ($CO_2$) laser. Accordingly, the central portion of the Gaussian beam is positioned in an edge region of the cavity C. In addition, when the width of the 2-3 portion P2-3 of the 3-1 metal layer 1610 is smaller than the radius of the beam size, a region other than the cavity forming region of the second insulating layer 1200 may be processed by the Gaussian beam. Accordingly, in the embodiment, the 2-3 portion P2-3 of the 3-1 metal layer 1610 may have a width greater than the radius of the Gaussian beam.

Next, referring to FIG. 19, the primary cavity processing may be performed on the second insulating layer 1200 using the 2-3 portion P2-3 of the 3-1 metal layer 1610 as a boundary line. In this case, the primary cavity processing may be performed using the carbon dioxide ($CO_2$) laser. In this case, a primary processed cavity Ca may have a trapezoidal-shaped horizontal cross section. For example, a width of the primary processed cavity Ca may gradually decrease from an upper portion toward a lower portion. In addition, glass fibers GF included in the second insulating layer 1200 may be exposed to the outside of the cavity through the primary processed cavity Ca.

Accordingly, in the embodiment, as shown in FIG. 20, the secondary cavity processing may be performed using the ultraviolet (UV) laser for the primary processed cavity.

That is, in the embodiment, the secondary processing may be performed using the ultraviolet (UV) laser for the cavity that has been primary processed by the carbon dioxide ($CO_2$) laser. That is, when the cavity is formed by the carbon dioxide ($CO_2$) laser, a step-shaped step is generated on the inner wall of the cavity to correspond to a movement interval of the laser source during laser processing. Accordingly, in the embodiment, the cavity formed by the carbon dioxide ($CO_2$) laser may be secondary processed using the ultraviolet (UV) laser. Specifically, the secondary processing of the cavity using the ultraviolet (UV) laser may be performed only on the inner wall of the cavity that has been primarily processed.

Next, referring to FIG. 21, when the processing of the cavity C is completed, portions of the 1-1 metal layer 1410 and the 3-1 metal layer 1610 that are left for processing the cavity C are removed.

That is, in the embodiment, for cavity processing, the 1-3 portion P1-3 of the 1-1 metal layer 1410 serving as the seed layer and the 2-3 portion P2-3 of the 3-1 metal layer 1610 are left without being removal. In addition, when the processing of the cavity C is completed, in the embodiment, a process of removing the 1-3 portion P1-3 of the 1-1 metal layer 1410 and the 2-3 portion P2-3 of the 3-1 metal layer 1610 may be performed. In this case, as in the first embodiment, at least a part of the 1-3 portion P1-3 of the 1-1 metal layer 1410 and the 2-3 portion P2-3 of the 3-1 metal layer 1610 may be left without being removed.

Next, referring to FIG. 22, in the embodiment, a process of forming protective layers 1800 and 1850 on the upper surface of the second insulating layer 1200 and the lower surface of the third insulating layer 1300 may be performed, respectively.

In addition, the structure of FIGS. 11 to 13 corresponding to the modified example of the first embodiment may be implemented with a structure corresponding to the second embodiment.

FIGS. 23A and 23B are views specifically showing a structure of a cavity according to a third embodiment.

FIG. 23A shows a circuit board for a case in which the second insulating layer described in the first and second embodiments is composed of a plurality of layers. In addition, FIG. 23B shows a circuit board for a case in which the second insulating layer is composed of a single layer.

Referring to FIGS. 23A and 23B, a cavity may be formed in a second insulating layer 2120.

The cavity may be formed by opening a plurality of second insulating layers 2120 (see FIG. 23A), or the cavity may be formed by opening a single second insulating layer 2120 (see FIG. 23B). When the cavity is formed in the plurality of second insulating layers (e.g., 2-1 to 2-3 insulating layers), the cavity may include a first part formed on the 2-1 insulating layer and a second part formed on the 2-2 insulating layer, and a third part formed on the 2-3 insulating layer.

In this case, the cavity may include inner walls S1, S2, and S3. The inner walls S1, S2, and S3 of the cavity may have a predetermined surface roughness. In this case, in the embodiment, an additional process is not performed so that the inner walls S1, S2, and S3 of the cavity have a predetermined surface roughness, but the surface roughness may be formed during the laser process for forming the cavity.

Meanwhile, the inner wall of the cavity may be divided into a plurality of parts. For example, the inner wall of the cavity may be divided into a first portion S3, a second portion S2, and a third portion S1 from a lower side thereof. In this case, each of inclination angles of the first portion S3, the second portion S2, and the third portion S1 may be different from each other. In addition, surface roughness of at least one portion of the first portion S3, the second portion S2, and the third portion S1 may be different from surface roughness of the other portion. For example, surface roughness of the second portion S2 may be the same as surface roughness of the third portion S1. However, the surface roughness of the second portion S2 and the third portion S1 may be different from surface roughness of the first portion S3. This is because at least one portion of the first portion S3, the second portion S2, and the third portion S1 constituting the inner wall of the cavity is formed by a process different from that of the other portions. For example, the second portion S2 and the third portion S1 are portions formed through a laser process and a desmear process. Alternatively, the first portion S3 is a portion formed by removing a part of the circuit pattern. Therefore, the second portion S2 and the third portion S1 have surface roughness corresponding to laser process and desmear process conditions, and the first portion S3 may have surface roughness corresponding to surface roughness of a side surface of a part of the circuit pattern.

Meanwhile, in the embodiment, the cavity C is formed using a Gaussian beam. In this case, the outermost portion of the cavity C is processed using a center point of the Gaussian beam. That is, a laser having greatest intensity is generated at the center point of the Gaussian beam, and accordingly, the inclination angle of the inner wall of the cavity C in the outermost portion may be smaller than that of the comparative example.

In other words, the inner wall of the cavity may have a shape in which the first portion S3, the second portion S2, and the third portion S1 are connected to each other from the lower side thereof. The first portion S3 of the cavity may be connected to the upper surface of the first insulating layer 110. For example, the first portion S3 of the cavity may be in contact with the upper surface of the first insulating layer 110. The first portion S3 of the inner wall of the cavity may have a first inclination angle. For example, the inclination angle of the first portion S3 of the cavity may be substantially perpendicular to a reference plane BS.

The second portion S2 of the cavity may have a second inclination angle $\theta 2$. For example, the second inclination angle $\theta 2$ of the second portion S2 of the cavity may refer to an inclination angle of a virtual straight line connecting one end E1 and the other end E3 of the second portion S2 with respect to the reference surface BS. The reference plane BS may be, for example, the upper surface of the first insulating layer 110, but the embodiment is not limited thereto.

In addition, the third portion S1 of the cavity may have a third inclination angle $\theta 1$. For example, the third inclination angle $\theta 1$ of the third portion S1 of the cavity may be smaller than the second inclination angle $\theta 2$ of the second portion S2. The third inclination angle $\theta 1$ of the third portion S1 may refer to an inclination angle of a virtual straight line connecting one end E2 and the other end E1 of the third portion S1.

That is, the third portion S1 of the inner wall of the cavity is a portion processed using the center point of the Gaussian beam, and accordingly, the third portion S1 may have a third inclination angle $\theta 1$ smaller than the second inclination angle $\theta 2$ of the second portion S2.

The inclination angle $\theta 2$ of the second portion S2 of the inner wall of the cavity may have a range of 130 degrees to 160 degrees. In addition, the third inclination angle $\theta 1$ of the third portion S1 of the inner wall of the cavity may have a range of 92 degrees to 130 degrees smaller than the second inclination angle $\theta 2$ of the second portion S2.

In other words, the inner wall of the cavity in the embodiment may have a plurality of inflection points. The inflection point may also be expressed as an inflection portion or a portion in which an angle changes.

For example, the inner wall of the cavity in the embodiment may have a first inflection point E3 and a second inflection point E2.

In addition, in the embodiment, the cavity may be divided into the first portion S3 having the first inclination angle and the second portion S2 having the second inclination angle θ2 based on the first inflection point E3. In addition, in the embodiment, the cavity may be divided into the second portion S2 having the second inclination angle θ2 and the third portion S1 having the third inclination angle based on the second inflection point E2.

The first inflection point E3 may be a point where the first portion S3 and the second portion S2 of the inner wall of the cavity meet each other. In addition, the second inflection point E2 may be a point where the second portion S2 and the third portion S1 of the inner wall of the cavity meet each other.

A height of the first inflection point E3 may correspond to a height of the circuit pattern 140. Preferably, the height of the first inflection point E3 may be the same as a height of a part of the first circuit pattern 141 disposed on the upper surface of the first insulating layer 110. More preferably, the height of the first inflection point E3 may be the same as a height of the seed layer constituting the first circuit pattern 141.

In addition, a height of the second inflection point E2 may be positioned higher than an upper surface of the pad 2141.

In the embodiment as described above, when the cavity is formed, the third portion S1 of the outermost portion of the cavity has the third inclination angle θ1, and the second portion S2 meeting the third portion S1 has the second inclination angle θ2, and the first portion S3 meeting the second portion S2 has the first inclination angle.

This may be implemented by laser processing a first metal layer 2140a, which is the seed layer constituting the circuit pattern, as a stop layer to form the cavity, and further by processing the outermost portion of the cavity using the center point of the Gaussian beam, and accordingly, as the inclination angle of the outermost portion of the cavity is reduced compared to the comparative example, the space required for forming the cavity may be remarkably reduced.

Accordingly, in the embodiment, the cavity may include a first region including the third portion S1, a second region including the second portion S2, and a third region other than them.

The second portion S2 of the inner wall of the cavity corresponding to the second region extends upward from the first portion S3 which is an end of the third region R3 of the cavity while having the second inclination angle θ2.

In addition, the third portion S1 corresponding to the first region R1 may extend upward from the second portion S2 while having the third inclination angle θ1.

FIG. 24 is a view for describing a method of processing the cavity according to the third embodiment, and FIG. 25 is a view for describing a method of processing a cavity according to the comparative example.

Referring to FIG. 24, in the embodiment, the outermost region of the cavity is processed by using the beam of the center line of the Gaussian beam. In addition, in the embodiment, the entire region of the cavity is processed while moving the Gaussian beam by a predetermined distance.

In this case, in the embodiment, the outermost region of the cavity is processed by using a center line of a first Gaussian beam. In addition, when cavity processing using the first Gaussian beam is completed, a second Gaussian beam is provided at a position spaced apart from the first Gaussian beam by a predetermined distance. In this case, as the first Gaussian beam and the second Gaussian beam are spaced apart by a predetermined distance, the cavity in the embodiment may include the third portion S1 having the third inclination angle θ1 in the outermost region and the second portion S2 extending from the third portion S1 and having the second inclination angle θ2.

Meanwhile, referring to FIG. 25, in the comparative example, the outermost portion of the laser beam is positioned at the outermost portion of the cavity to perform a process of the cavity processing.

Accordingly, an inner wall of the outermost portion of the cavity in the comparative example has an inclination angle of 160 degrees or more. On the other hand, in the embodiment, the inner wall of the outermost portion of the cavity has the third inclination angle in a range of 92 degrees to 130 degrees.

For example, in the process of the comparative example, when a cavity is processed in a region having a size of 600 µm, a cavity of 500 µm smaller than 600 µm is formed due to the inclination angle of the inner wall of the cavity. This is because the lower region of the cavity is used as a cavity in which an element is substantially mounted, and a space of about 100 µm cannot be used due to the inclination angle of the inner wall.

On the other hand, in the embodiment, when the cavity is processed in a region of a size of 600 µm, a cavity of 550 µm, which is greater than that of the comparative example, is formed due to the improvement of the inclination angle of the inner wall of the cavity. Accordingly, in the embodiment, it is possible to reduce the space required to form the cavity, thereby increasing the degree of integration of the circuit.

The invention claimed is:

1. A circuit board comprising:
   a first insulating layer;
   a second insulating layer disposed on the first insulating layer and including a cavity; and
   a circuit pattern layer disposed between the first insulating layer and the second insulating layer and including a first metal layer disposed on the first insulating layer and a second metal layer disposed on the first metal layer,
   wherein the circuit pattern layer includes a first circuit pattern including a side surface that is not covered by the second insulating layer and overlaps a perimeter of the cavity along a vertical direction,
   wherein a width of a first metal layer of the first circuit pattern in a horizontal direction is greater than a width of a second metal layer of the first circuit pattern in the horizontal direction,
   wherein a portion of a side surface of the first metal layer of the first circuit pattern is not covered by the second insulating layer, and
   wherein a side surface of the second metal layer of the first circuit pattern is entirely covered by the second insulating layer.

2. The circuit board of claim 1,
   wherein the first metal layer of the first circuit pattern includes a first portion that overlaps the second metal layer of the first circuit pattern along the vertical direction, and a second portion that is disposed closer to the cavity than the first portion and does not overlap the second metal layer of the first circuit pattern along the vertical direction, and
   wherein at least a portion of a side surface of the second portion is not covered by the second insulating layer.

3. The circuit board of claim 2,
wherein the second portion of the first metal layer of the first circuit pattern has a closed loop shape surrounding an outer side of the cavity.

4. The circuit board of claim 2,
wherein an upper surface of the first portion of the first metal layer of the first circuit pattern is covered with the second metal layer of the first circuit pattern, and
wherein an upper surface of the second portion of the first metal layer of the first circuit pattern is covered with the second insulating layer.

5. The circuit board of claim 1,
wherein the circuit pattern layer further includes a second circuit pattern overlapping the cavity along the vertical direction, and
wherein a side surface of the second circuit pattern does not have a step.

6. The circuit board of claim 5, wherein the first metal layer of the second circuit pattern and the second metal layer of the second circuit pattern have a same width in the horizontal direction.

7. The circuit board of claim 5,
wherein the circuit pattern layer further includes a third circuit pattern disposed further away from the cavity than the first circuit pattern, and
wherein a side surface of the third circuit pattern does not have a step.

8. The circuit board of claim 7,
wherein the first metal layer of the third circuit pattern and the second metal layer of the third circuit pattern have a same width in the horizontal direction.

9. The circuit board of claim 1,
wherein the second insulating layer includes a second-first insulating layer disposed on the first insulating layer, and a second-second insulating layer disposed on the second-first insulating layer, and
wherein the cavity includes a first through hole passing through the second-first insulating layer along the vertical direction, and a second through hole passing through the second-second insulating layer along the vertical direction.

10. The circuit board of claim 9,
wherein a width in the horizontal direction of the first through hole and a width in the horizontal direction of the second through hole are equal to each other.

11. The circuit board of claim 9,
wherein a width in the horizontal direction of the first through hole and a width in the horizontal direction of the second through hole are different from each other, and
wherein an inner wall of the cavity has a step.

12. The circuit board of claim 11,
wherein the width in the horizontal direction of the second through hole is greater than the width in the horizontal direction of the first through hole.

13. The circuit board of claim 1,
wherein an inner wall of the cavity is perpendicular to an upper surface of the first insulating layer.

\* \* \* \* \*